US006563165B2

(12) United States Patent
Sakakibara et al.

(10) Patent No.: US 6,563,165 B2
(45) Date of Patent: *May 13, 2003

(54) NON-VOLATILE SEMICONDUCTOR MEMORY DEVICE AND METHOD FOR PRODUCING THE SAME

(75) Inventors: Kiyohiko Sakakibara, Tokyo (JP); Hirotada Kuriyama, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/199,264

(22) Filed: Nov. 25, 1998

(65) Prior Publication Data

US 2002/0000603 A1 Jan. 3, 2002

(30) Foreign Application Priority Data

Jul. 21, 1998 (JP) ........................................... 10-204525
Aug. 19, 1998 (JP) ........................................... 10-232956

(51) Int. Cl.$^7$ ............................................. A01L 29/788
(52) U.S. Cl. ...................................... 257/315; 257/316
(58) Field of Search ................................. 257/315, 316; 365/185.01, 185.06, 185.33

(56) References Cited

U.S. PATENT DOCUMENTS 5,060,195 A * 10/1991 Gill et al. .................... 365/185
5,299,891 A * 4/1994 Yiu et al. .................... 257/316
5,436,478 A * 7/1995 Bergemont ................. 257/316
5,977,584 A * 11/1999 Kim ............................ 257/315
6,023,085 A * 2/2000 Fang ........................... 257/315
6,160,297 A * 12/2000 Shimizu et al. ............. 257/390

OTHER PUBLICATIONS

"A Shallow–Trench–Isolation Flash Memory Technology with a Source–Bias Programming Method", M. Kato, et al., IEDM 1996, pp. 177–180.

"A 0.24–$\mu m^2$ Cell Process with 0.18–$\mu m$ Width Isolation and 3–D Interpoly Dielectric Films for 1–Gb Flash Memories", T. Kobayashi, et al., IEDM 1997, pp. 275–278.

* cited by examiner

Primary Examiner—Sara Crane
(74) Attorney, Agent, or Firm—McDermott, Will & Emery

(57) ABSTRACT

A non-volatile semiconductor memory device comprising: a semiconductor substrate, memory cells, a region of memory cell array in which said memory cells are arranged in a matrix-like form, a region of peripheral circuit, a connecting region for connecting said region of memory cell array to said region of peripheral circuit, and conductive layers provided closest to said substrate with intervals between each other, wherein said intervals of said conductive layers are substantially equal to each other in said region of memory cell array and said connecting region, whereby when insulating films are formed and planarized after forming said conductive layers, it is possible to restrict producing of seams in the insulating films at stripped portions of the conductive layers.

3 Claims, 31 Drawing Sheets

21: LOWEST CONDUCTIVE LAYER IN REGION OF MEMORY CELL ARRAY
61: LOWEST CONDUCTIVE LAYER IN CONNECTING PORTION

21: LOWEST CONDUCTIVE LAYER IN REGION OF MEMORY CELL ARRAY
61: LOWEST CONDUCTIVE LAYER IN CONNECTING PORTION

F I G. 6
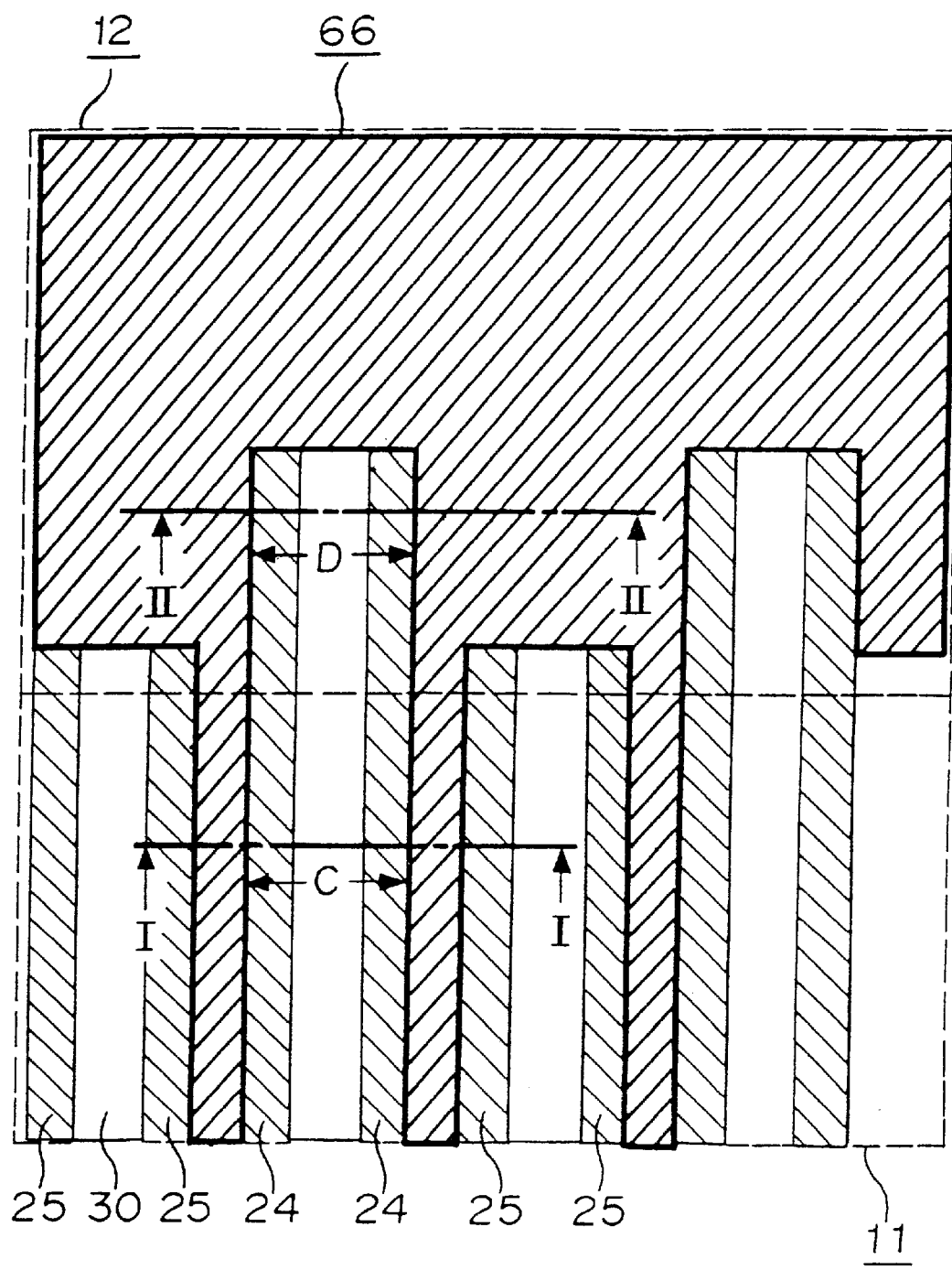

24: AREAS TO WHICH IONS ARE HARD TO BE IMPLANTED

NON-VOLATILE SEMICONDUCTOR MEMORY DEVICE AND METHOD FOR PRODUCING THE SAME

BACKGROUND OF THE INVENTION

1. Field of the Invention

The present invention relates to planarization after forming an inter-layer insulating film and an arrangement of a diffusion area in drain and a diffusion area in source formed by a layer in which impurities are diffused in a non-volatile semiconductor memory device and a method for producing the same.

2. Discussion of Background

An AND-type flash memory is one type of a large-capacity non-volatile flash memory in a semiconductor memory devices. The AND-type flash memory is described, for example, in IEDM *92 Technical Digest P. 991–993, *A 1.28 μm2 contactless memory cell technology for a 3 V-only 64 M bit EEPROM*, H. Kume et al.).

FIG. 13 is an equivalent circuit diagram of a region of memory cell array of a conventional AND-type flash memory and a connecting region for connecting the region of memory cell array to a region of peripheral circuit (not shown) described in the above document. In FIG. 13, numerical reference 1 designates a memory cell comprises a single transistor. Numerical reference 2 designates a floating gate of the transistor comprising the memory cell 1, which floating gate is composed of a plurality of conductive layers as described below. Numerical reference 3 designates a control gate; numerical references 4 and 5 respectively designate a local data line and a local source line, both of which are mode of an N+ diffusion layer; numerical reference 6 designates a grovel data line made of a metallic wire; numerical reference 7 designates a common source line which is connected to ground potential; numerical reference 8 designates a first selection transistor for connecting the grovel data line 6 to the local data line 4; numerical reference 9 designates a second selection transistor for connecting the local source line 5 to the common source line 7; numerical reference 10 designates a word line which is arranged at a substantially right angle with respect to the local data line and connected to the control gate 3; numerical reference 11 designates a region of memory cell array in which the memory cells 1 are arranged in a matrix-like form; numerical reference 12 designates a region of first selection gate in which the first selection transistors 8 are arranged; and numerical reference 13 designates a region of second selection gate in which the second selection transistors 9 are arranged, wherein the region of first selection gate 12 and the region of second selection gate 13 are connecting regions adjacent to the region of memory cell array 11 and the region of peripheral circuit (not shown).

In the next, operation of the conventional AND-type flash memory described above will be briefly explained. The operation to be described below is recently improved and is different from the operation described in the above document. There are three types of operation of (a) write, (b) read, and (c) erase. A characteristic of the operation in the above AND-type flash memory is that all memory cells connected to a word line simultaneously become any one of operational conditions among the above three types.

In FIGS. 14a through 14c, a memory cell array in a matrix-like form of 2×2 is shown for explaining the operation. A case that a memory cells c1 and c2 are selected will be described, where a condition that electrons are injected into a floating gate is expressed by data of "1", and a condition that electrons are not injected is expressed by data of "0".

(a) Write Operation

In write operation, "1" is written in the memory cell c1 and "0" is written in the memory cell c2. As shown in FIG. 14a, electric potential of a word line w1 to be selected is 18 V; electric potential of a non-selecting word line w2 is 4.5 V; electric potential of a local data line d1 connected to the memory cell c1 is 0 V; electric potential of a local data line connected to the memory cell c2 is 6.5 V; local source lines s1, s2 are in an opened state, (i.e. floating); and electric potential of a substrate is 0 V. Under such a condition, because a potential difference between the word line w1 and the local data line d1 is large, "1" is written in only the floating gate of memory cell c1 by injecting electrons thereinto.

(b) Read Operation

In read operation, data written in the write operation, namely "1" from the memory cell c1 and "0" from the memory cell c2, are read out. As shown in FIG. 14b, electric potential of the word line to be selected w1 is 5 V; electric potential of the non-selecting word line w2 is 0 V; electric potential of local data lines d1, d2 is 1 V; electric potential of local source lines s1, s2 is 0 V; and electric potential of the substrate is 0 V. Under such a condition, because electrons are injected into a floating gate of memory cell c1, Vth is high and therefore an electric current does not flow into the local data line d1, a transistor of the memory cell c1, and the local source line s1. On the contrary, because electrons are not implanted into a floating gate of memory cell c2, Vth is low and therefore an electric current flows into the local data line d2, a transistor of the memory cell c2, and the local source line s2.

(c) Erase Operation

In erase operation, a word "erase" means that all of the data written in the write operation are changed to "0". As shown in FIG. 14c, electric potential of the word line w1 to be selected is -18 V; electric potential of the non-selecting word line w2 is 0 V; electric potential of the local data lines d1, d2 is 0 V; the local source lines s1, s2 are in an opened state; and electric potential of the substrate is 0 V. Accordingly, electrons are drawn out from the floating gate of memory cell c1 and thereby the memory cells c1 and c2 have data of "0".

In the next, layout pattern after forming a first metallic film (i.e. first metal) is shown in FIG. 15, which corresponds to the region of memory cell array 11 and the region of first selection gate 12 in FIG. 13. Hereinbelow, portions of the layout pattern of FIG. 15 are explained in correspondence with circuit components of the equivalent circuit diagram of FIG. 13. The floating gate 2 shown in FIG. 13 is composed of two layers of polysilicon. Although amorphous silicon can substitutes for polysilicon, a case that polysilicon is used will be described hereinbelow. Numerical reference 21 of FIG. 15 designates a lower floating gate made of first polysilicon; and numerical reference 22 designates an upper floating gate made of second polysilicon. Numerical reference 23 of FIG. 15 designates third polysilicon for composing the control gate 3 and the word line 10 of FIG. 13, wherein although the third polysilicon may be substituted by a double-layer structure of polysilicon and silicide for reducing resistance, a case that polysilicon is used will be described hereinbelow. Numerical reference 24 of FIG. 15 designates a diffused area in drain of the transistors of the memory cell, which area is made of an N+ diffusion layer.

Hereinbelow, this diffused area in drain is referred to as a drain area. The drain area corresponds to the local data line 4 of FIG. 13. Numerical reference 25 of FIG. 15 is a diffused area in source of the transistors of the memory cell, which area is made of an N+ diffusion layer. Hereinbelow, the diffused area in source is referred to as a source area. The source area corresponds to the local source line 5 of FIG. 13. Numerical reference 26 of FIG. 15 corresponds to the grovel data line 6 of FIG. 13 made of a first metal; numerical reference 27 designates a drain source area of the first selection transistor 8; numerical reference 28 designates a gate of the first selection transistor 8 made of the third polysilicon; numerical reference 29 designates a metal contact for connecting the grovel data line 26 to the drain source area 27 of the first selection transistor; and numeral reference 30 designates trench isolation formed as an isolating area.

Further, numerical references 31 through 33 of FIG. 15 respectively designate remaining gates of the first polysilicon through the third polysilicon formed in the region of first selection gate 12, which gates are provided to leave patterns of polysilicon used for the gates of memory cell transistors to other than the region of memory cell array.

A boundary k between the region of memory cell array and the region of first selection gate 12 as a connection region thereto shown in FIG. 15 is at an end portion of the region of memory cell array, namely an edge of the memory cell. However, the drain area 24 and the source area 25 of the transistors of memory cell continuously extend from the region of memory cell array 11 to the region of first selection gate 12. Therefore, the drain area 24 and the source area 25 will be designated by the same references even in the region of first selection gate 12. The drain area 24 and the source area 25 of the transistors of memory cell extend on the memory cell array 11 substantially in parallel and substantially in linear. Further, the drain area 24 of the transistors of memory cell is connected to the drain source area 27 of the first selection transistor at the region of first selection gate 12.

In the next, FIG. 16 shows cross sectional views of the above-described regions. FIG. 16a is a cross sectional view of the region of memory cell array 11 in FIG. 15 taken along a line I—I; FIG. 16b is a cross sectional view of the region of first selection gate 12 shown in FIG. 15 taken along a line II—II; and FIG. 16c is a cross sectional view of a generally used region of region of peripheral circuit (not shown) of AND-type flash memory.

In FIG. 16a, numerical reference 40 designates a silicon substrate; numerical reference 41 designates a tunnel insulation film; numerical reference 42 designates an inter-layer insulating film as an insulating layer; numerical reference 43 designate an oxide/nitride/oxide multi-layered dieelectric (hereinbelow referred to as ONO film) which is a multi-layered insulating film composed of a silicon oxide film, a silicon nitride film, and silicon oxide film; and numerical reference 44 designates an inter-layer insulating film located below the first metal.

As for FIG. 16b, explanation of the numerical references is omitted because these are the same as those shown in FIG. 15 and FIG. 16a. A primary feature in FIG. 16b is that the remaining gate 31 of the first polysilicon is continuously connected to the remaining gate 32 of the second polysilicon.

In FIG. 16c, numerical reference 45 designates a gate insulating film of transistor in the peripheral circuit; numerical reference 46 designates a gate of transistor made of the third polysilicon; numerical reference 47 designates a drain source area of transistor; numerical reference 48 designates a metal contact; and numerical reference 49 designates a first metal wire.

Then a method of producing the above-mentioned conventional AND-type flash memory will be described. FIG. 17 is a schematic flow chart of the method of producing, and FIGS. 18a through 26c show cross sectional views of the regions respectively by manufacturing steps. FIGS. 18a, 19a, 20a, 21a, 22a, 23a, 24a, 25a, and 26a show the region of memory cell array; FIGS. 18b, 19b, 20b, 21b, 22b, 23b, 24b, 25b, and 26b show the region of first selection gate; and FIGS. 18c, 19c, 20c, 21c, 22c, 23c, 24c, 25c, and 26c show the region of generally used peripheral circuit in an AND-type flash memory, respectively showing in section like FIGS. 16a, 16b, and 16c.

In the next, the manufacturing steps will be explained in correspondence with the cross sectional views of these regions in a sequential manner, based on FIG. 17.

(1) a first step (formation of the isolating area): FIGS. 18a through 18c correspond thereto. The trench isolation 30 is formed as isolation in the silicon substrate 40.

(2) a second step (formation of the tunnel insulation film): FIGS. 19a through 19c correspond thereto. The tunnel insulation film 41 having a thickness of about 8 through 15 nm is formed between the silicon substrate 40 and the lower floating gate 21 to be formed in a post process.

(3) a third step (formation of the lower floating gate): FIGS. 20a through 20c correspond thereto. Numerical reference 51 designates first polysilicon of the region of peripheral circuit to be removed in a post process; and numerical reference 52 designates a silicon nitride film. The first polysilicon having a thickness of about 80 through 120 nm and the silicon nitride film having a thickness of about 180 through 250 nm are deposited, and the lower floating gate 21 and the remaining gate 31 of the first polysilicon are formed.

(4) a fourth step (formation of the first drain source area): FIGS. 21a through 21c correspond thereto. The drain area 24 and the source area 25 are formed in a part of the region of memory cell array and a part of the connecting region by implanting ions.

(5) a fifth step (formation of the inter-layer insulating film and planarization): FIGS. 22a through 22c correspond thereto. After laminating the inter-layer insulating film having a thickness of about 500 through 800 nm, the inter-layer insulating film in the region of peripheral circuit is completely removed by planarization, whereby the inter-layer insulating film 42 is left in the region of memory cell array and the connecting region.

(6) a sixth step (removal of the silicon nitride film): FIGS. 23a through 23c correspond thereto. The silicon nitride film 52 is removed.

(7) a seventh step (formation of the upper floating gate): FIGS. 24a through 24c correspond thereto. Numerical reference 53 designates second polysilicon in the region of peripheral circuit to be removed in a post step. The second polysilicon having a thickness of about 30 through 80 nm is deposited, and the upper floating gate 22 and the remaining gate 32 of the second polysilicon are formed.

(8) an eighth step (formation of the ONO film): FIGS. 25a through 25c correspond thereto. The ONO film 43 having a thickness of about 10 through 20 nm in a conversion value as an oxide film, which will be an inter-layer insulating film between the upper floating gate 22 and the control gate 23 to be form in a post step, is formed. Succeedingly, the tunnel insulating film of the region of peripheral circuit, the first polysilicon, the second polysilicon, and the ONO film are removed.

(9) a ninth step (formation of the gate insulating film): FIGS. 26a through 26c correspond thereto. The gate insulating film 45 of transistor in the peripheral circuit is formed.

(10) a tenth step (formation of the control gate and the gate of transistors in the region of peripheral circuit and that in the connecting region): FIGS. 27a through 27c correspond thereto. The third polysilicon having a thickness of about 100 though 300 nm is deposited and the control gate 23 of the region of memory cell array, the remaining gate 33 of the third polysilicon in the connecting region, the gate 28 of the first selection transistor (shown in FIG. 15 not in FIG. 27b), and gate 46 of transistor in the peripheral circuit are formed.

(11) an eleventh step (formation of the second drain source area): FIGS. 28a through 28c correspond thereto. The drain source area 47 in the region of peripheral circuit and the drain source area 27 of the connecting region (shown in FIG. 15 not in FIG. 28b) are formed by implanting ions.

(12) a twelfth step (formation of the inter-layer insulating film under the first metal, formation of the metal contact and formation of the first metal): FIGS. 16a through 16c correspond thereto. After forming the inter-layer insulating film 44, the metal contact 48 and the metal contact 29 (shown in FIG. 15 not in FIG. 16b) are respectively formed in the region of peripheral circuit and in the connecting region. Thereafter, metal wires of the grovel data line 26 in the region of memory cell array and the connecting region and those in the region of peripheral circuit 49 are formed.

The method of producing has been wholly described in the above. Further, the fifth step of the formation of the inter-layer insulating film and the planarization will be described in detail because this has been improved recently. In FIGS. 28a through 28c and 29a through 29c, cross sectional views of the regions are shown as in the above. In FIGS. 29a through 29c, after depositing the inter-layer insulating film 42, chemical mechanical polish (hereinbelow referred to as CMP) is conducted and further etch back is conducted by dry etching to thereby substantially remove the inter-layer insulating film in the region of peripheral circuit-However, as shown in FIG. 29c, small pieces of remaining inter-layer insulating film 54 exists in the silicon nitride film 52 of the region of peripheral circuit, wherein the remaining inter-layer insulating film works as a mask for the silicon nitride film in the post step of removing the silicon nitride film to thereby cause a problem of remaining first polysilicon. Accordingly, as shown in FIGS. 30a through 30c, wet etching is additionally performed to thereby remove the remaining inter-layer insulating film 54 in the region of peripheral circuit almost completely.

However, in the above described semiconductor device and the method of producing the device, there were three problems as below.

The first problem is that a seam 55 occurred in the inter-layer insulating film 42 within the region of first selection gate as the connecting region as shown in FIG. 30b.

In FIG. 31, a layout pattern after the wet etching is performed to the region of memory cell array 11 and the region of first selection gate 12 in correspondence with FIG. 15 is shown. Numerical reference 56 designates a laminating pattern of the first polysilicon and the silicon nitride film. Although a seam was not generated in the region of memory cell array designated by reference A in FIGS. 15 and 31 having a wide clicking width by the laminating pattern 56, a seam 55 was produced in a portion where a clicking width is narrow designated by reference B in FIGS. 15 and 31 within the connecting region. A reason for producing this is considered that portions having a narrow clicking width by the laminating pattern 56 had a tendency that a characteristic of burying was bad despite the formation of the inter-layer insulating film by chemical vapor deposition (hereinbelow, referred to as CVD). Accordingly, it is considered that when wet etching is conducted for removing the remaining inter-layer insulating film, in the portions having a narrow clicking width are excessively etched to thereby produce a seam 55.

If such a seam exists, when the remaining gate 32 of the second polysilicon is formed in a post step, the remaining gate 32 of the second polysilicon is shorted to the drain area 24 of transistor of the memory cell. Ordinarily, the remaining gate 32 of the second polysilicon is applied with constant electric potential. Therefore, there was a problem that electric potential of the local data line 4, namely that of the drain area of memory cell transistor, became abnormal and normal operation could not be conducted.

Further, although it was possible to prevent a seam caused by wet etching from generating by covering the region of first selection gate 12 with a resist, there was another problem that the method of producing was complicated because the number of masks was increased.

In the next, the second problem was that the drain area 24 of memory cell transistor within the region of first selection gate 12 was difficult to be formed by shadowing. In other words, although the first drain source was formed after forming the first polysilicon and the silicon nitride film, when the drain source was formed by obliquely implanting ions as shown in FIG. 33, the ions were difficult to be implanted to a place to be the drain area 24 of memory cell transistor in the region of first selection gate 12 having a narrow interval of the first polysilicon, not like in the region of memory cell array 11. This is because the pattern of the first polysilicon 31 and of the silicon nitride film 52 works as a barrier, whereby the drain area 24 of memory cell transistor can not be sufficiently formed.

Heretofore, the region of memory cell array 11 and the region of first selection gate 12 are exemplified. However, this problem also occurs in the region of second selection gate 13 which is a connecting region, which is similar to the region of first selection gate 12.

FIG. 34 shows a positional relationship between the region of memory cell array 11, the drain area 24 of memory cell transistor within the region of first selection gate 12, and the source area 25 of memory cell transistor within the region of second selection gate 13. From this Figure, it is known that the drain area 24 of memory cell transistor and the source area 25 of memory cell transistor respectively extend from the region of memory cell array 11. Therefore, also in the region of second selection gate 13, the above-mentioned problem occurred in this extending area.

The third problem is about an yield of device caused by the region of memory cell array. As shown in FIG. 15, the drain area 24 and the source area 25 of memory cell transistors are adjacent to each other interposing the trench isolation 30. When the drain area 24 was shorted to the source area 25 in the memory cell transistors by a pattern defect such as a foreign matter generated in the above trench isolation 30, the drain area 24 of memory cell transistor, namely the local data line 4, and the source area 25, namely the local source line 5, were applied with different values of electric potential as described in correspondence with FIGS. 14a through 14c, whereby the memory cell connected to the local data line and/or the local source line could not be normally operated. Accordingly, a part of the memory cell in such a portion can not be used to thereby cause a drop of yield.

It is an object of the present invention to solve the above-mentioned problems inherent in the conventional techniques and to restrict production of seams in a connecting region.

Another object of the present invention is to prevent short from occurring even though seams are generated.

Another object of the present invention is to suppress occurrence of shadowing when the drain source are implanted.

Another object of the present invention is to restrict a drop of yield caused by short between a local data line and a local source line.

Another object of the present invention is to provide a method of producing a semiconductor device by which production of seams is restricted without increasing the number of masks and to suppress occurrence of shadowing.

According to a first aspect of the present invention, there is provided a non-volatile semiconductor memory device comprising:

a semiconductor substrate, memory cells, a region of memory cell array in which the memory cells are arranged in a matrix-like form, a region of peripheral circuit, a connecting region for connecting the region of memory cell array to the region of peripheral circuit, and conductive layers provided in the substrate with intervals between each other, wherein the interval of the conductive layers in the region of memory cell array is substantially equal to the interval in the connecting region.

According to a second aspect of the present invention, there is provided a non-volatile semiconductor memory device according to the first aspect of the invention, wherein the intervals are 0.5 μm or more.

According to a third aspect of the present invention, there is provided a non-volatile semiconductor memory device comprising:

a semiconductor substrate, memory cells formed in the semiconductor substrate, transistors for constituting the memory cells, diffused areas in drain and diffused area in source both for constituting the transistors, and a region of memory cell array in which the memory cells are arranged in a matrix-like form, wherein the diffused areas in drain and the diffused areas in source extend in a predetermined direction and substantially in parallel to each other on the region of memory cell array; and the diffused areas in drain and the diffused areas in source are respectively formed interposing isolating areas.

According to a fourth aspect of the present invention, there is provided a non-volatile semiconductor memory device according to the third aspect of the invention, further comprising:

a region of peripheral circuit, a connecting region for connecting the region of memory cell array to the peripheral circuit, conductive layers provided in the substrate with intervals between each other, wherein between the conductive layers, the diffused areas in drain or the diffused areas in source are respectively provided; and the interval in the the region of memory cell array is substantially equal to the interval in the connecting region and the connecting region.

According to a fifth aspect of the present invention, there is provided a non-volatile semiconductor memory device according to the fourth aspect of the invention, wherein the intervals are 0.5 μm or more According to a sixth aspect of the present invention, there is provided a method of producing a non-volatile semiconductor memory device having memory cells, a region of memory cell array in which the memory cells are arranged in a matrix-like form, a region of peripheral circuit, and a connecting region for connecting the region of memory cell array to the region of peripheral circuit, which comprises:

a step of forming conductive layers in the region of memory cell array, in the region of peripheral circuit, and in the connecting region, a step of patterning the conductive layers so that the interval between the conductive layers in the region of memory cell array is substantially equal to the interval in the connecting region, a step of forming insulating layers on the conductive layers, and a step of substantially planarizing the insulating layers According to a seventh aspect of the present invention, there is provided a method of producing non-volatile semiconductor memory device according to the sixth aspect of the invention, wherein the intervals of conductive layers is 0.5 μm or more.

According to an eighth aspect of the invention, there is provided a non-volatile semiconductor memory device comprising:

a semiconductor substrate, memory cells formed in the semiconductor substrate, transistors for constituting the memory cells, diffused areas in drain and diffused in source both for constituting the transistors, a region of memory cell array in which the memory cells are arranged in a matrix-like form, wherein the diffused areas in drain and the diffused areas in source extend in a predetermined direction and substantially in parallel to each other on the region of memory cell array; and the diffused areas in drain are formed interposing isolating areas.

According to a ninth aspect of the present invention, there is provided a non-volatile semiconductor memory device according to the eighth aspect of the invention, wherein adjacent memory cells among the memory cells commonly have the diffused area in source; and the width of the diffused areas in drain and the width of the diffused areas in source are substantially equal to each other.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 schematically shows a layout pattern of the region of memory cell array and the connecting region after the fifth step according to Embodiment 1 of the present invention;

DETAILED DESCRIPTION OF THE PREFERRED EMBODIMENTS

A detailed explanation will be given of preferred Embodiments of the present invention in reference to FIGS. 1 through 34 as follows, wherein the same numerical references are used for the same or the similar portions and description of these portions is omitted.

Embodiment 1

Figure 1:
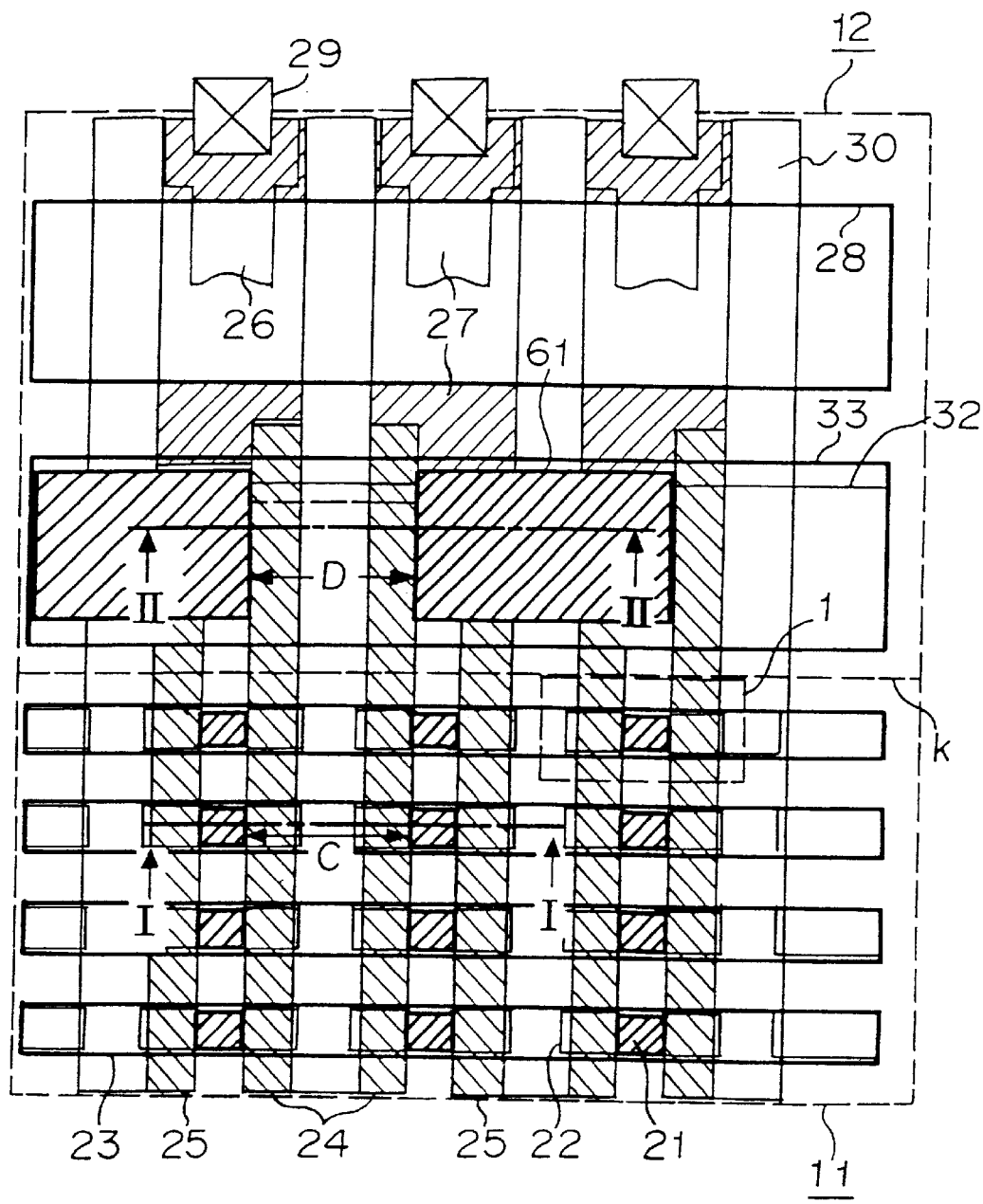
FIG. 1 schematically shows a layout pattern of a region of memory cell array and a connecting region after forming a first metal of a semiconductor device according to Embodiment 1 of the present invention.

FIG. 1 shows the semiconductor device according to Embodiment 1 of the present invention, wherein a layout pattern of the region of memory cell array and the region of first selection gate after forming the first metal is shown. In FIG. 1, numerical reference 1 designates a memory cell; numerical reference 11 designates a region of memory cell array; numerical reference 12 designates a region of first selection gate; numerical reference 21 designates a lower floating gate formed by first polysilicon; and numerical reference 22 designates an upper floating gate formed by second polysilicon. Numerical reference 24 designates a drain area of transistors of the memory cell formed by an N+ diffused layer, which drain area corresponds to a local data line 4 shown in FIG. 13; and numerical reference 25 designates a source area of transistors of the memory cell formed by an N+ diffused layer, which source layer corresponds to a local data line 5 shown in FIG. 13. Numerical reference 26 corresponds to a grovel data line 6 formed by the first metal shown in FIG. 13; numerical reference 27 corresponds to a drain source area of a first selection transistor; numerical reference 28 designates a gate of the first selection transistor formed by third polysilicon; numerical reference 29 designates a metal contact for connecting the grovel data line 26 to the drain source area 27 of the selection transistor; and numerical reference 30 designates trench isolation formed as an isolating area.

Numerical reference 32 designates a remaining gate of the second polysilicon formed in the first selection gate; and numerical reference 33 designates a remaining gate of the third polysilicon formed in the first selection gate 12. Similarly, numerical reference 61 designates a remaining gate of the first polysilicon.

There are two differences in layout patterns between the conventional techniques and Embodiment 1.

Figure 15:
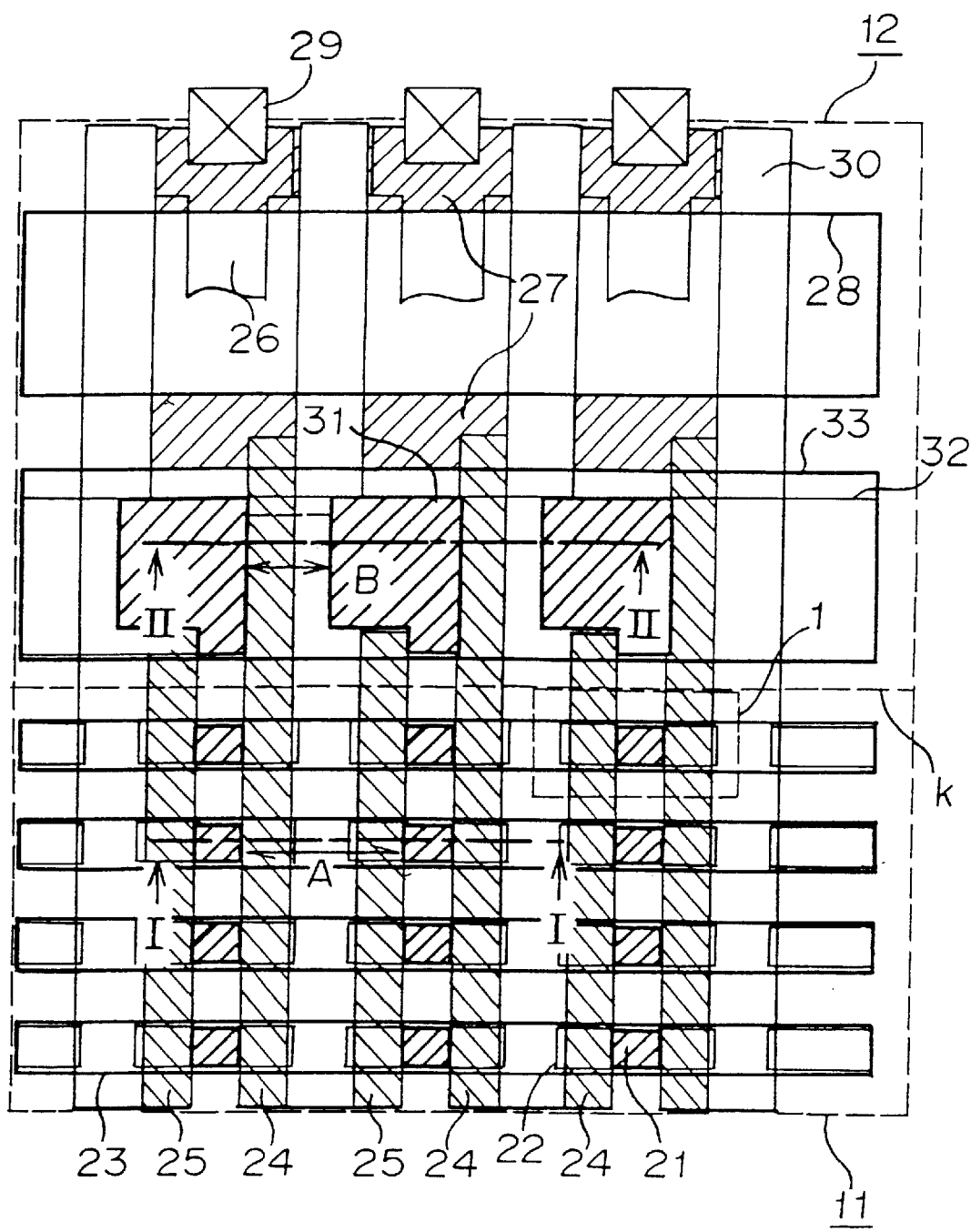
FIG. 15 schematically shows a layout pattern of a region of memory cell array and a connecting region of the conventional semiconductor device after forming a first metal.

The first difference is a space between pieces of first polysilicon, which is the lowest conductive layer. Conventionally, as shown in FIG. 15, a space B between remaining gates 31 of first polysilicon in a region of first selection gate 12 is narrower than a space A between floating gates made of first polysilicon in a region of memory cell array 11. However, in Embodiment 1, a space D between pieces of first polysilicon in the region of first selection gate 12 is equal to a space C in the region of memory cell array as shown in FIG. 1.

The second difference is a relationship between a drain area 24 and a source area 25 of transistors in a memory cell. Conventionally, the drain area 24 and the source area 25 of transistors in the memory cell are oppositely arranged to each other interposing the trench isolation 30. However, in Embodiment 1, the drain areas 24 of transistors of the memory cell are oppositely arranged to each other interposing the trench isolation 30, and also the source areas 25 of transistors of the memory cell are oppositely arranged to each other interposing the trench isolation 30.

Figure 2A:
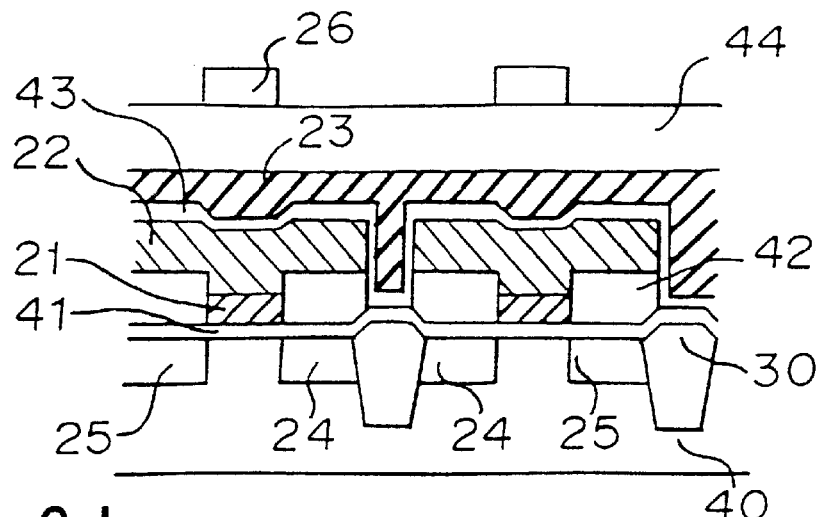
FIG. 2a is a cross sectional view for showing a part of the region of memory cell array in the semiconductor device after forming the first metal according to Embodiment 1 of the present invention.
Figure 2B:
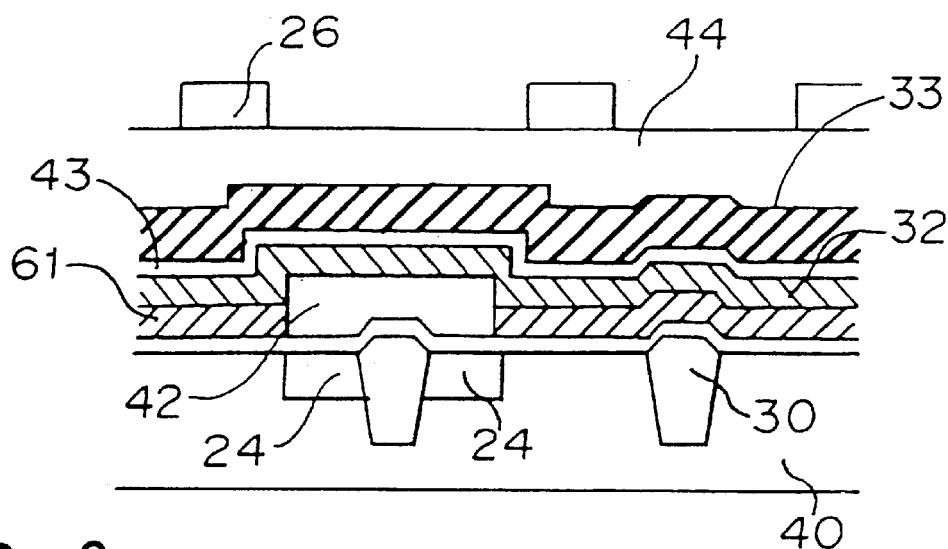
FIG. 2b is a cross sectional view for showing a part of the connecting region of the semiconductor device after forming the first metal according to Embodiment 1 of the present invention.
Figure 2C:
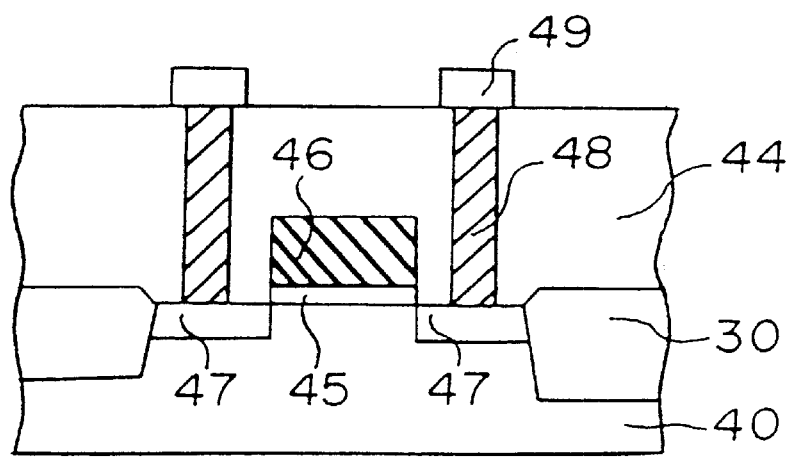
FIG. 2c is a cross sectional view for showing a part of a region of peripheral circuit of the semiconductor device after forming the first metal according to Embodiment 1 of the present invention.

In the next, FIGS. 2a through 2c show cross sectional views of the region of memory cell array, the connecting region, and the region of peripheral circuit. FIG. 2a is a cross sectional view of the region of memory cell array 11 taken along a line I—I in FIG. 1. FIG. 2b is a cross sectional view for showing the region of first selection gate 12 taken along a line II—II in FIG. 1. FIG. 2c is a cross sectional view for showing a generally used region of peripheral circuit of AND-type flash memory (not shown).

In FIG. 2a, numerical reference 40 designates a silicon substrate; numerical reference 41 designates a tunnel insulating layer; numerical reference 42 designates an inter-layer insulating film which is an insulating layer; numerical reference 43 designates an ONO film; and numerical reference 44 designates an inter-layer insulating film positioned below the metal.

In the next, as for FIG. 2b, description of numerical references is omitted because these are the same as the numerical references used in FIGS. 1 2a. A specific characteristic is that the remaining gate 61 of the first polysilicon is continuously connected to the remaining gate 32 of the second polysilicon.

In FIG. 2c, numerical reference 45 designates a gate insulating film of transistors in the peripheral circuit; numerical reference 46 designates a gate of transistor in the peripheral circuit made of third polysilicon; numerical reference 47 designates a drain source area of transistor in the peripheral circuit; numerical reference 48 designates a metal contact; and numerical reference 49 designates a first metal wire.

There are two differences in the region of first selection gate of FIG. 2b between the conventional techniques and Embodiment 1.

The first difference is about a space of the first polysilicon which is the lowest conductive layer, wherein the space D in the region of first selection gate 12 is widen to be substantially equal to that in the region of memory cell array as shown in the above-mentioned layout pattern.

Figure 16A:
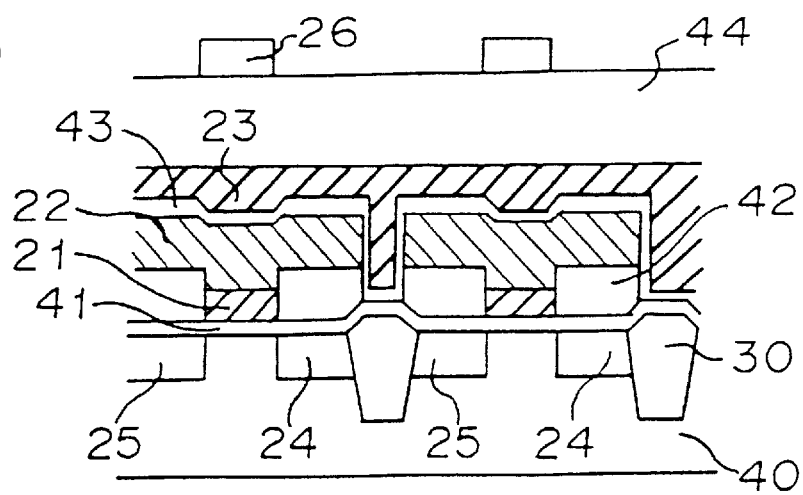
FIG. 16a is a cross sectional view for showing a part of a region of memory cell array of the conventional semiconductor device after forming the first metal.
Figure 16B:
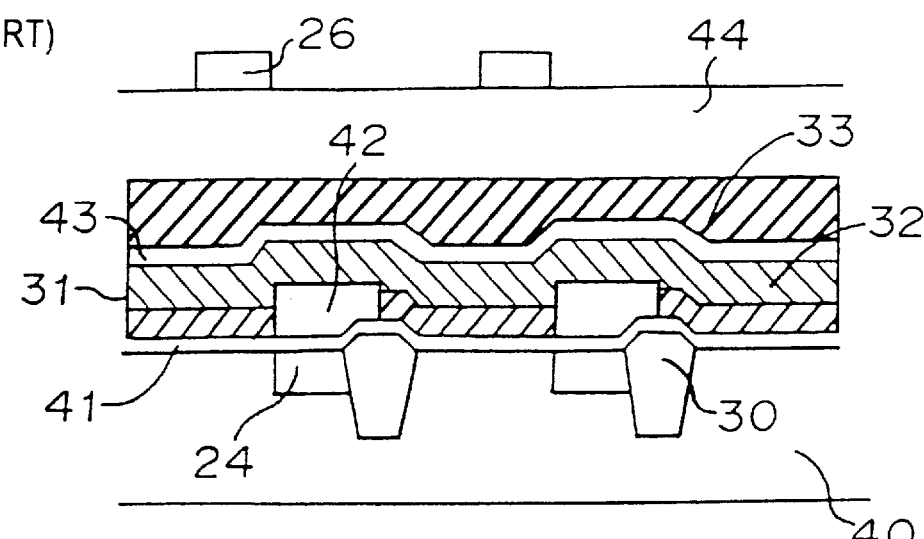
FIG. 16b is a cross sectional view for showing a part of the connecting region of the conventional semiconductor device after forming the first metal.
Figure 16C:
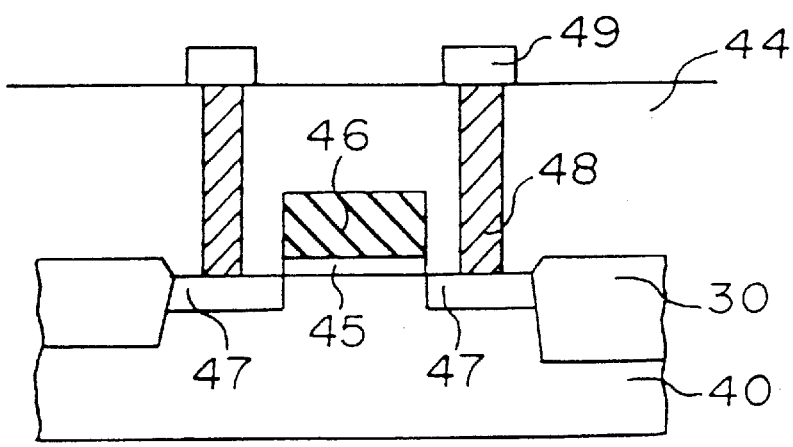
FIG. 16c is a cross sectional view for showing a part of a region of peripheral circuit of the conventional semiconductor device after forming the first metal.

The second difference is about arrangement of the drain area 24 of the memory cell. As shown in FIG. 16b, the drain area 24 in the memory cell is conventionally formed only on one side of the trench isolation 30. However, in Embodiment 1, two drain areas 24 are oppositely arranged to each other interposing the trench isolation 30.

In the next, a method of producing the semiconductor device according to Embodiment 1 will be described. In this, a third step of forming a lower floating gate through a fifth step of forming an inter-layer insulating film and planarizing are shown. As in FIGS. 2a through 2c, FIGS. 3a, 4a, and 5a are cross sectional views taken along the line I—I of the region of memory cell array; FIGS. 3b, 4b and 5b are cross sectional view taken along the line II—II of the region of first selection gate; and FIGS. 3c, 4c and 5c are cross sectional view of the region of peripheral circuit (not shown).

Figure 3A:
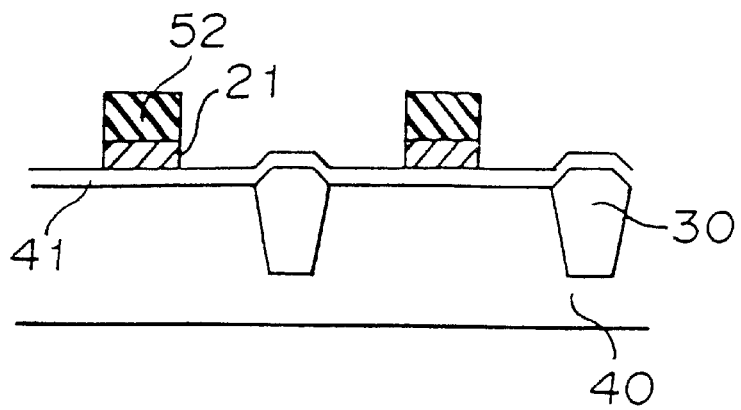
FIG. 3a is a cross sectional view for showing a part of the region of memory cell array of the semiconductor device after a third step according to Embodiment 1 of the present invention.
Figure 3B:
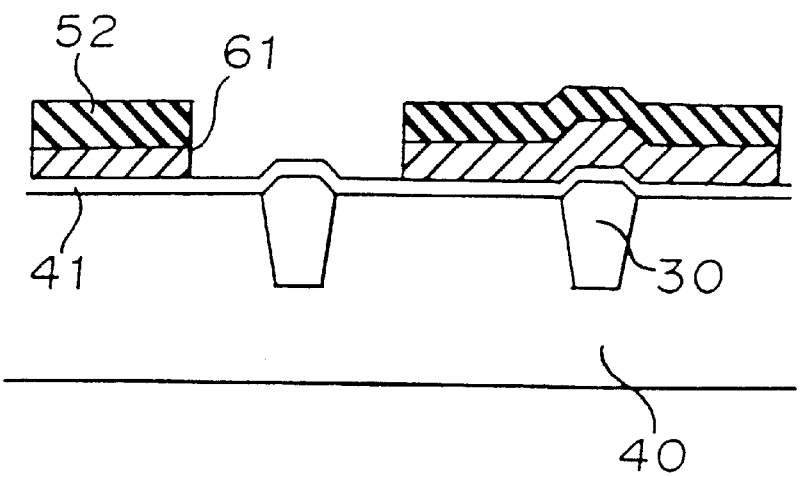
FIG. 3b is a cross sectional view for showing a part of the connecting region of the semiconductor device after the third step according to Embodiment 1 of the present invention.
Figure 3C:
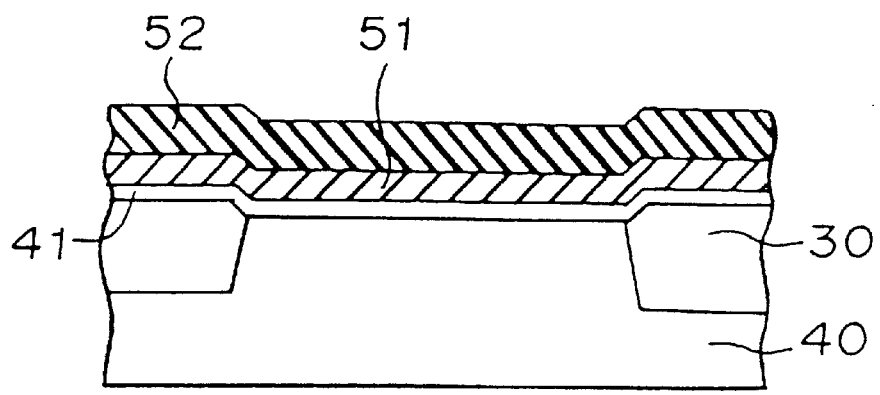
FIG. 3c is a cross sectional view for showing a part of the region of peripheral circuit of the semiconductor device after the third step according to Embodiment 1 of the present invention.

(i) The third step (formation of a lower floating gate): corresponding to FIGS. 3a through 3c, numerical reference 51 designates first polysilicon of the region of peripheral circuit to be removed in a post step; and numerical reference 52 designates a silicon nitride film. The first polysilicon having a thickness of about 80 through 120 nm and the silicon nitride film having a thickness of about 180 through 250 nm are deposited to form a lower floating gate 21 and a remaining gate 61 of the first polysilicon.

Figure 4A:
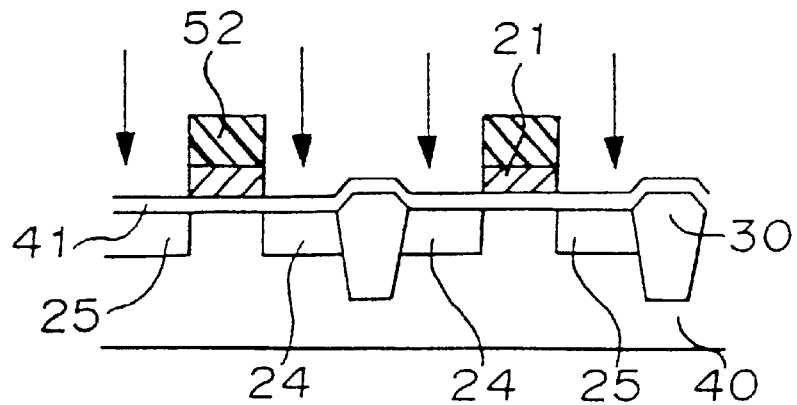
FIG. 4a is a cross sectional view for showing a part of the region of memory cell array of the semiconductor device after a fourth step according to Embodiment 1 of the present invention.
Figure 4B:
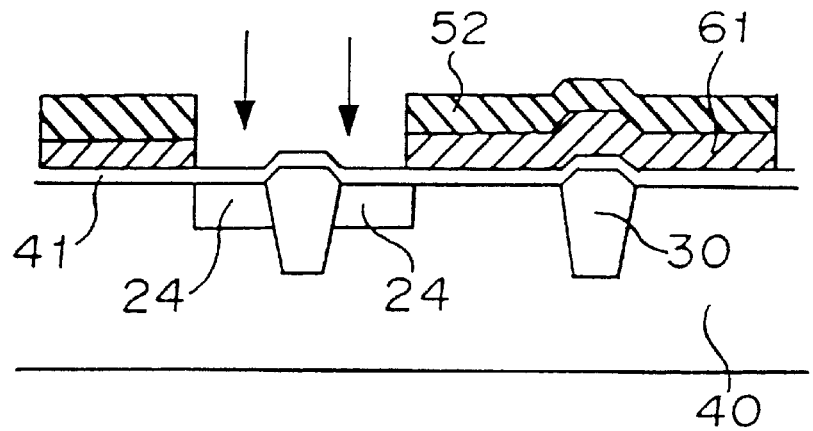
FIG. 4b is a cross sectional view for showing a part of the connecting region of the semiconductor device after the fourth step according to Embodiment 1 of the present invention.
Figure 4C:
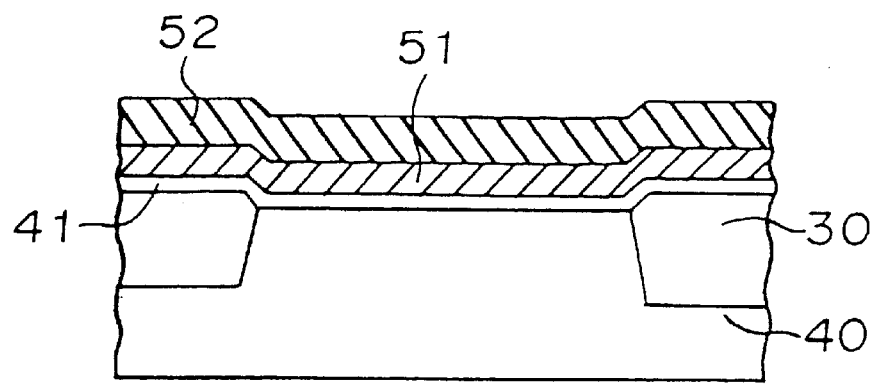
FIG. 4c is a cross sectional view for showing a part of the region of peripheral circuit of the semiconductor device after the fourth step according to Embodiment 1 of the present invention.

(ii) The fourth step (formation of a first drain source area): corresponding to FIGS. 4a through 4c, a drain area 24 and a source area 25 are formed in a portion of the region of memory cell array and a portion of the connecting region by implanting ions.

Figure 5A:
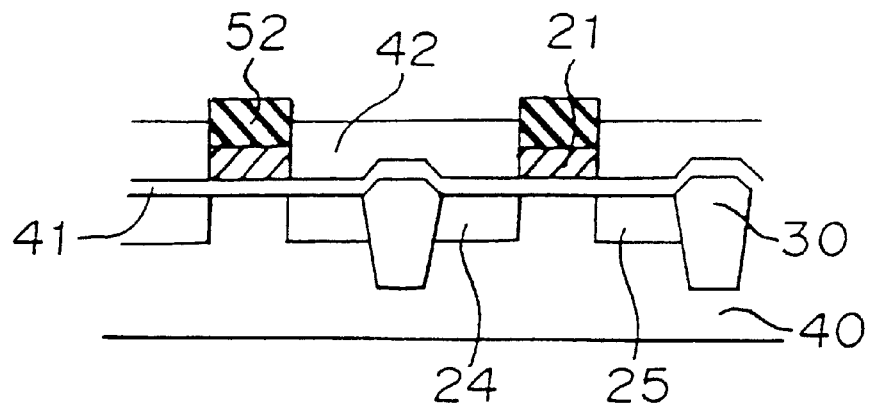
FIG. 5a is a cross sectional view for showing a part of the region of memory cell array of the semiconductor device after a fifth step according to Embodiment 1 of the present invention.
Figure 5B:
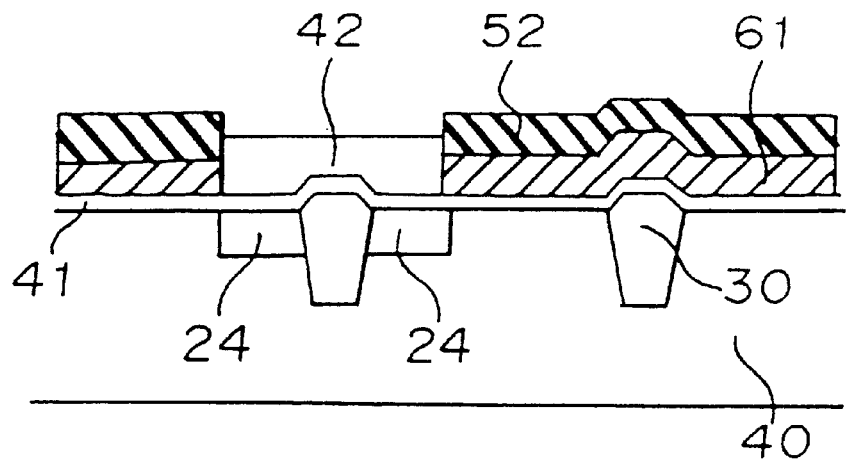
FIG. 5b is a cross sectional view for showing a part of the connecting region of the semiconductor device after the fifth step according to Embodiment 1 of the present invention.
Figure 5C:
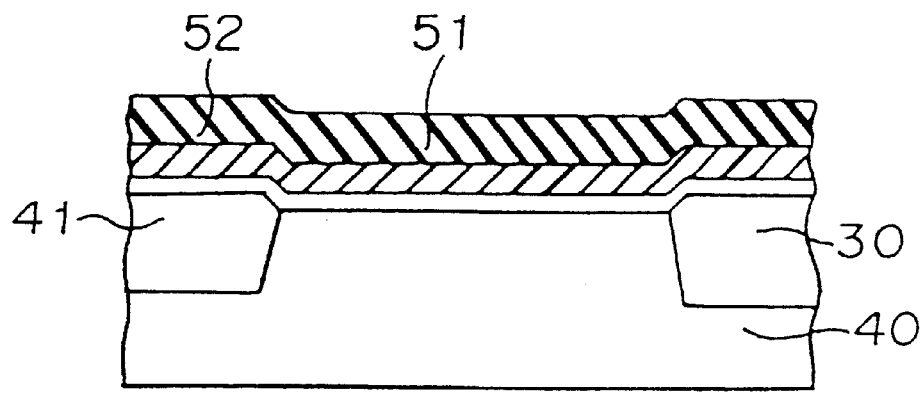
FIG. 5c is a cross sectional view for showing a part of the region of peripheral circuit of the semiconductor device after the fifth step according to Embodiment 1 of the present invention.
Figure 7:
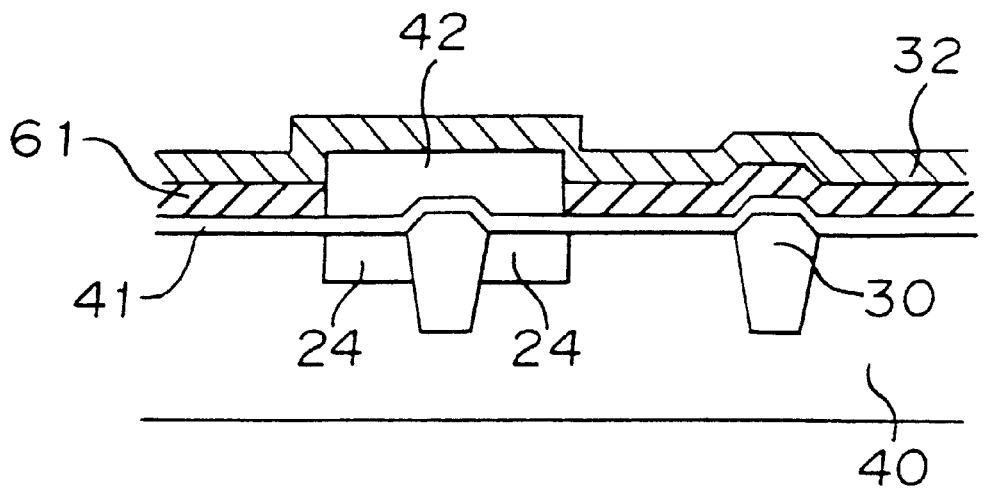
FIG. 7 is a cross sectional view of the semiconductor device after a seventh step according to Embodiment 1 of the present invention.

(iii) The fifth step (formation of an inter-layer insulating film and planarization): corresponding to FIGS. 5a through 5c, after laminating the inter-layer insulating film 42 having a thickness of about 500 through 800 nm, chemical mechanical polish (i.e. CMP) is conducted. Further, etch back is performed by dry etching to substantially remove the inter-layer insulating film in the region of peripheral circuit. Further, wet etching is additionally performed to further substantially remove the remaining inter-layer insulating film in the region of peripheral circuit.

Figure 31:
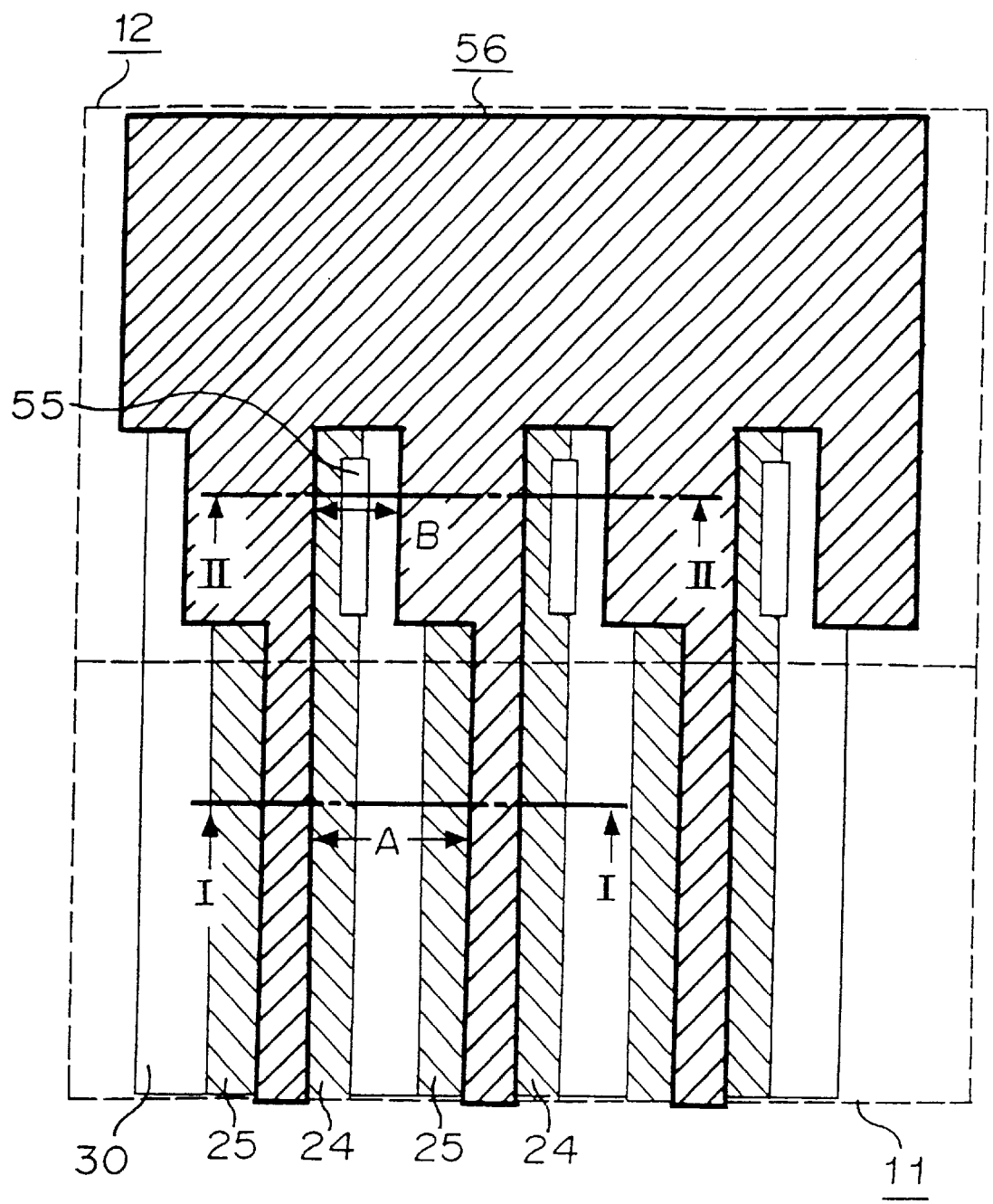
FIG. 31 schematically shows a layout pattern of the region of memory cell array and the connecting region of the conventional semiconductor device after the fifth step.
Figure 32:
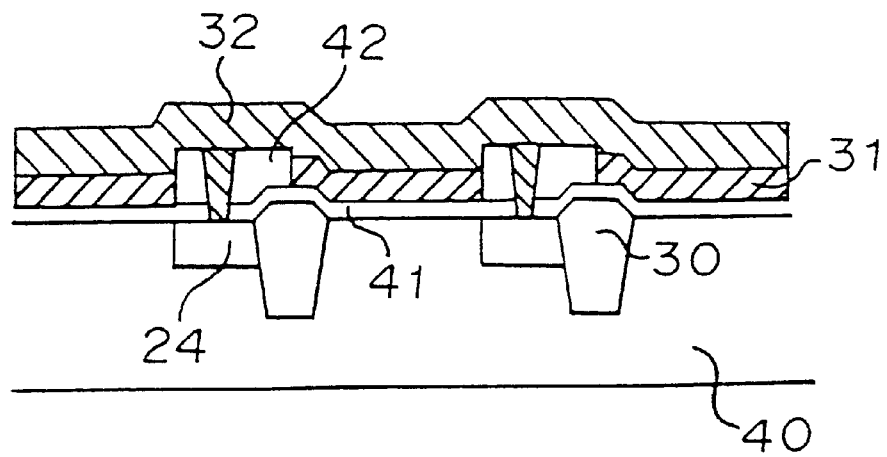
FIG. 32 is a cross sectional view for showing the connecting region of the conventional semiconductor device in the seventh step.
Figure 33:
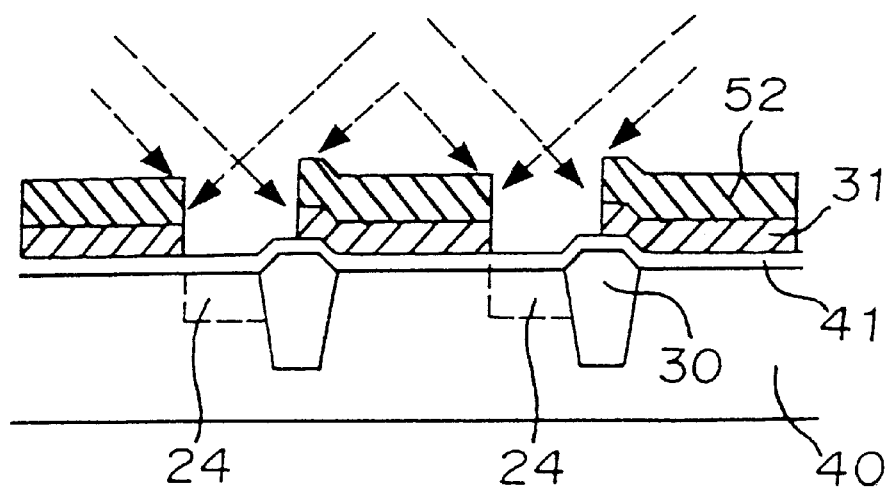
FIG. 33 schematically shows the connecting region of the conventional semiconductor device in section when ions are obliquely implanted in the fourth step.
Figure 34:
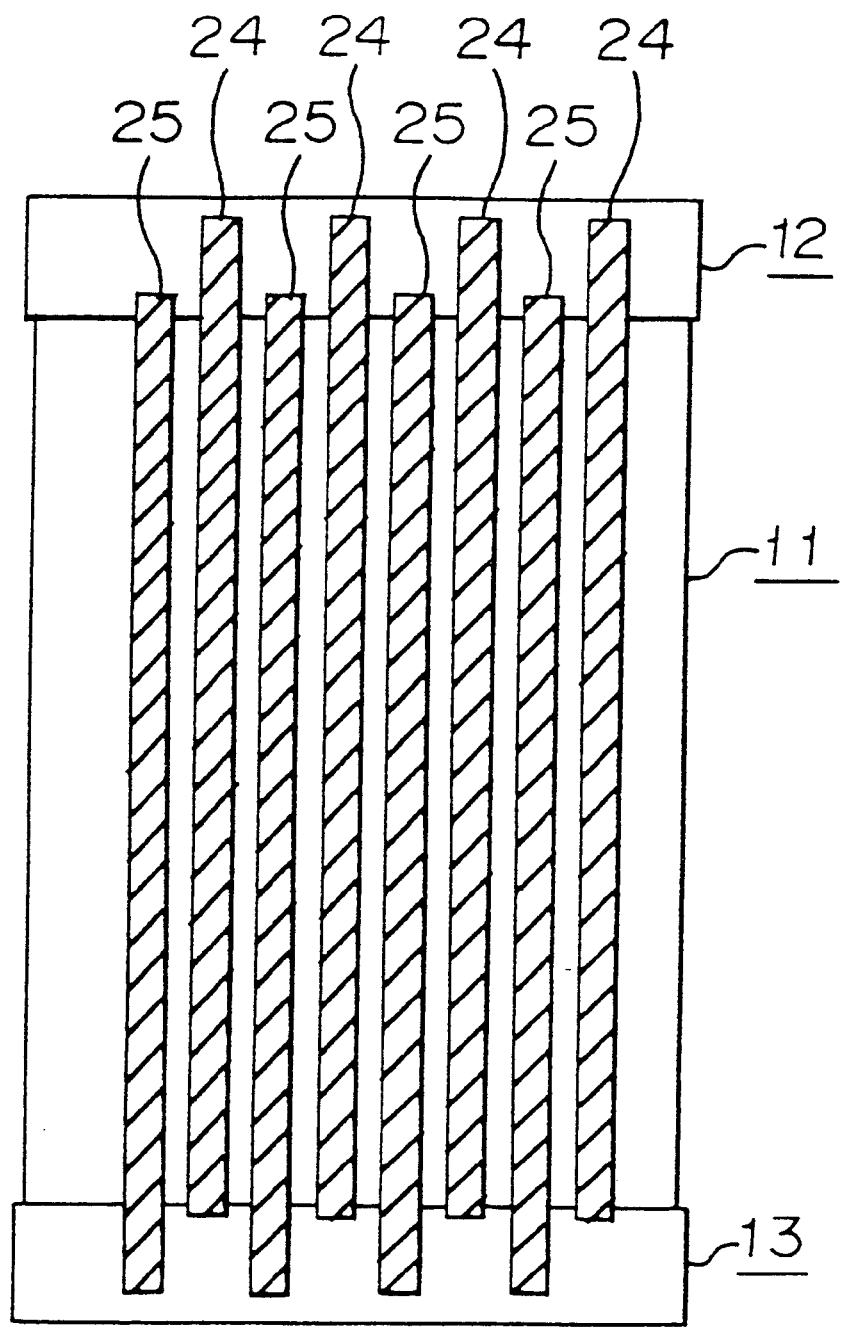
FIG. 34 schematically shows an arrangement of a drain area and a source area of transistors in the memory cell of the conventional semiconductor device.

Further, as for the planarization, FIG. 6 shows a layout pattern of the region of memory cell array 11 and the region of first selection gate 12 after the wet etching in correspondence with FIG. 5. Numerical reference 66 designates a pattern of laminating the first polysilicon and the silicon nitride film. In use of this FIG. 6, it will be described that production of a seam, which is the first problem in the conventional technique, is restricted. In Embodiment 1, the width D of the first polysilicon in the region of first selection gate 12 is equal to the width C in the region of memory cell array 11, wherein the width C becomes wider than that in the conventional technique. Accordingly, it is possible to substantially bury the inter-layer insulating film. Therefore, even though wet etching is conducted to remove the remaining inter-layer insulating film (numerical reference 54 in FIG. 29) of the region of peripheral circuit in a post step, the seam 55 shown in FIG. 31 is not generated. Accordingly, the problem in the conventional technique such as a short does not occur even though a remaining gate 32 of second polysilicon is formed in a post step.

Further, as shown in the method of producing in Embodiment 1, it is possible to prevent a seam from generating by wet etching without covering the region of first selection gate 12 by a resist, whereby the number of masks is not increased and the method of producing is easy.

Figure 8:
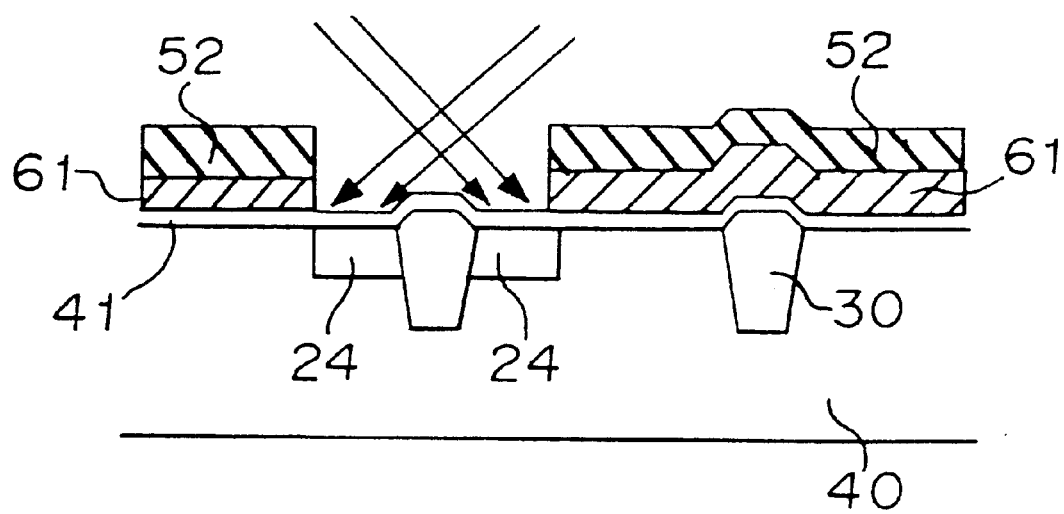
FIG. 8 schematically shows a part of the connecting region of the semiconductor device in section at a time of obliquely implanting ions in the fourth step of Embodiment 1 of the present invention.
Figure 17:
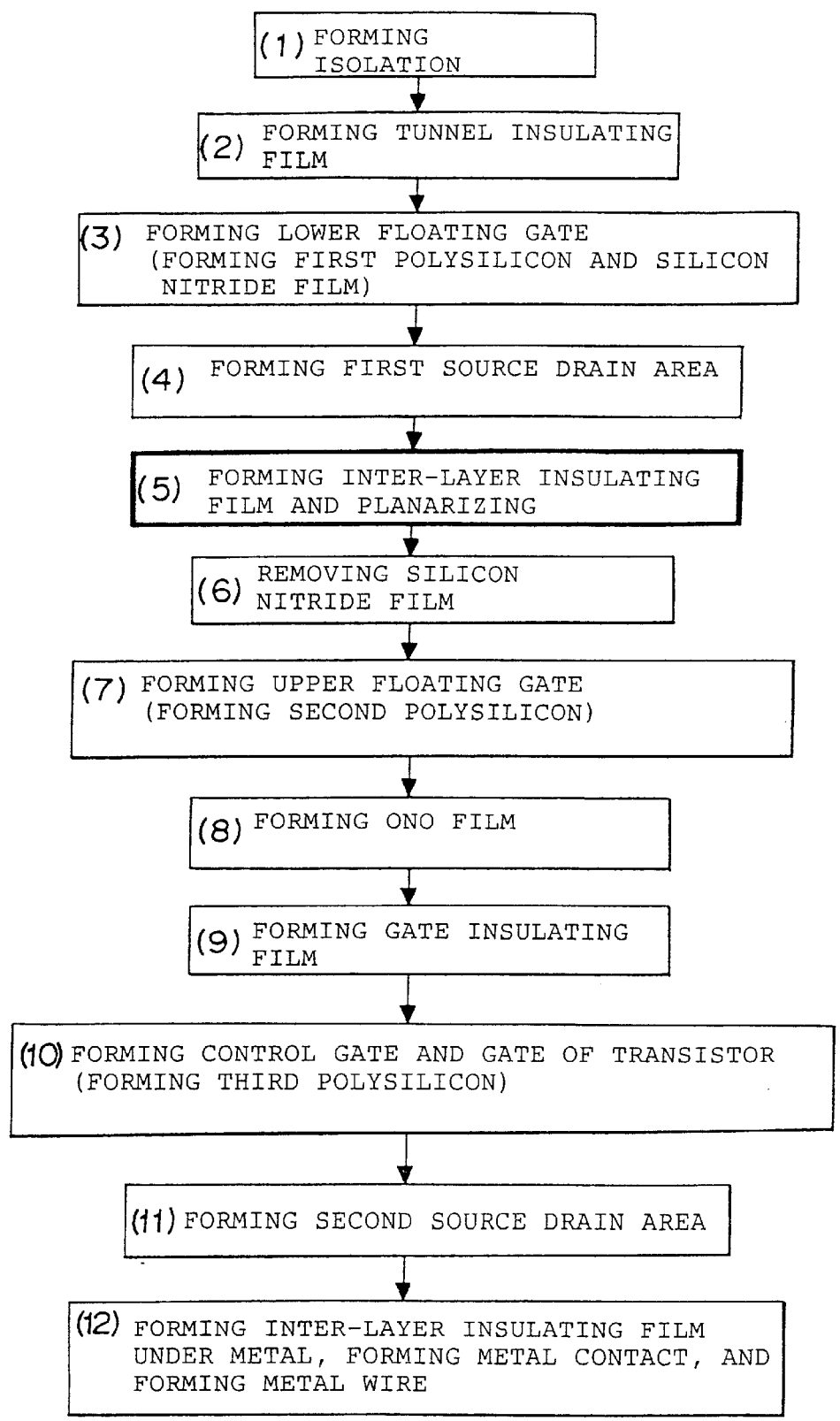
FIG. 17 is a flow chart of summarizing a method of producing the conventional semiconductor device.
Figure 18:
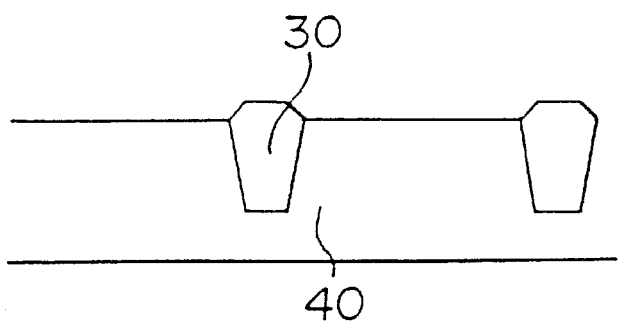
FIG. 18a is a cross sectional view for showing a part of the region of memory cell array of the conventional semiconductor device after a first step.
FIG. 18b is a cross sectional view for showing a part of the connecting region of the conventional semiconductor device after the first step.
FIG. 18c is a cross sectional view for showing the region of region of peripheral circuit of the conventional semiconductor device after the first step.
Figure 18:
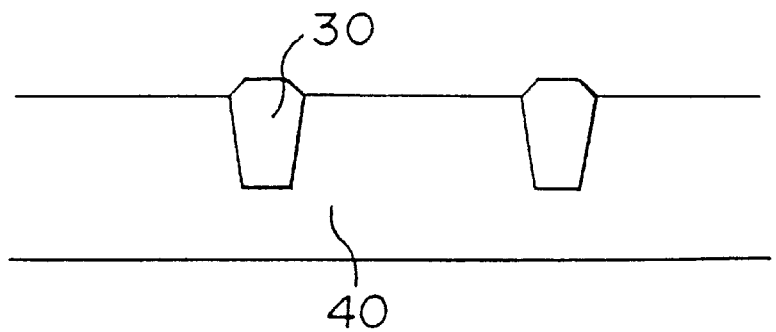
Figure 18:
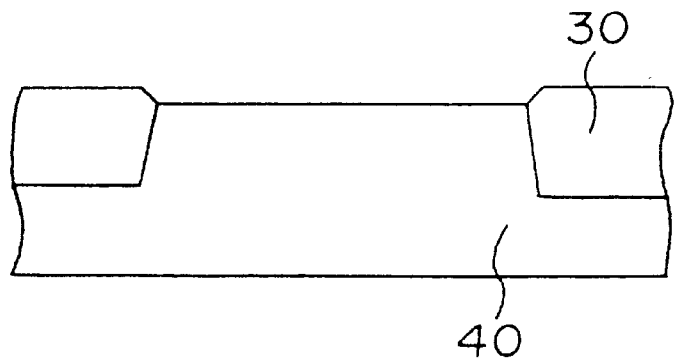
Figure 19A:
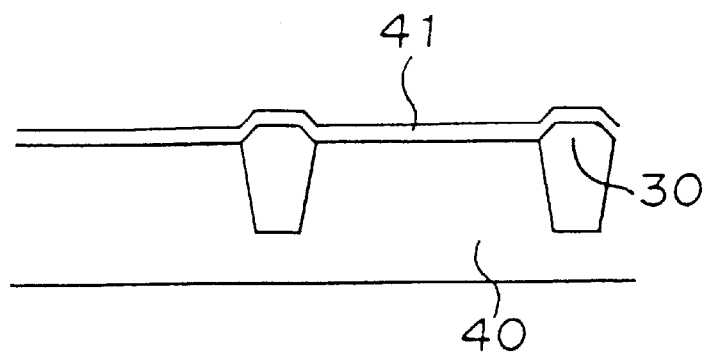
FIG. 19a is a cross sectional view for showing a part of the region of memory cell array of the conventional semiconductor device after a second step.
Figure 19B:
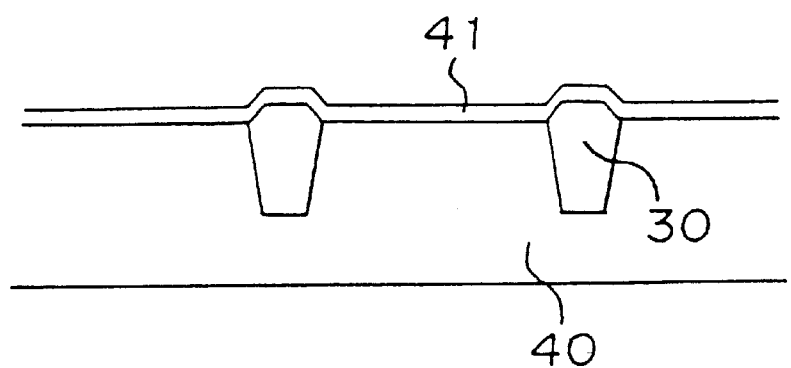
FIG. 19b is a cross sectional view for showing a part of the connecting region of the conventional semiconductor device after the second step.
Figure 19C:
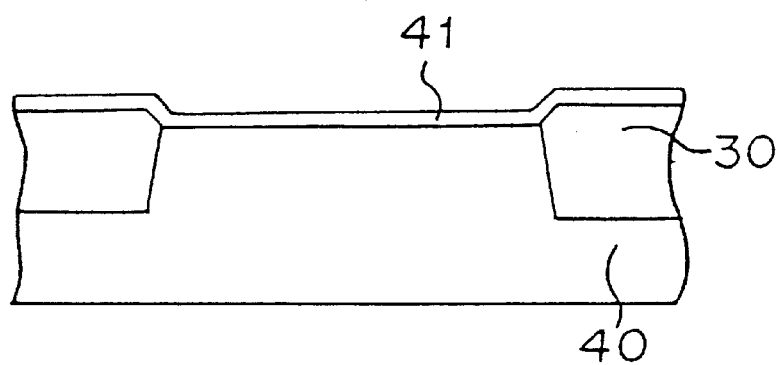
FIG. 19c is a cross sectional view for showing a part of the region of peripheral circuit of the conventional semiconductor device after the second step.
Figure 20:
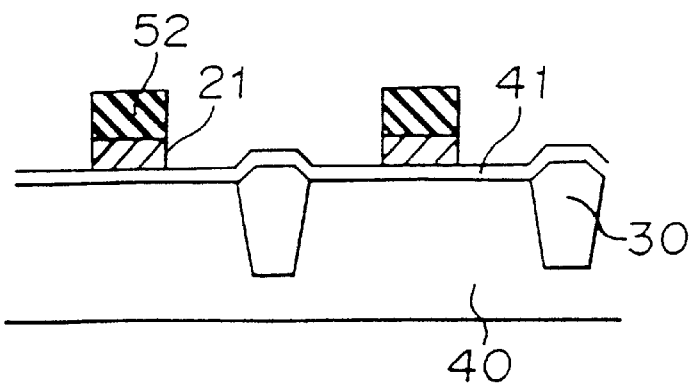
FIG. 20a is a cross sectional view for showing a part of the region of memory cell array of the conventional semiconductor device after a third step.
FIG. 20b is a cross sectional view for showing a part of the connecting region of the conventional semiconductor device after the third step.
FIG. 20c is a cross sectional view for showing a part of the region of peripheral circuit of the conventional semiconductor device after the third step.
Figure 20:
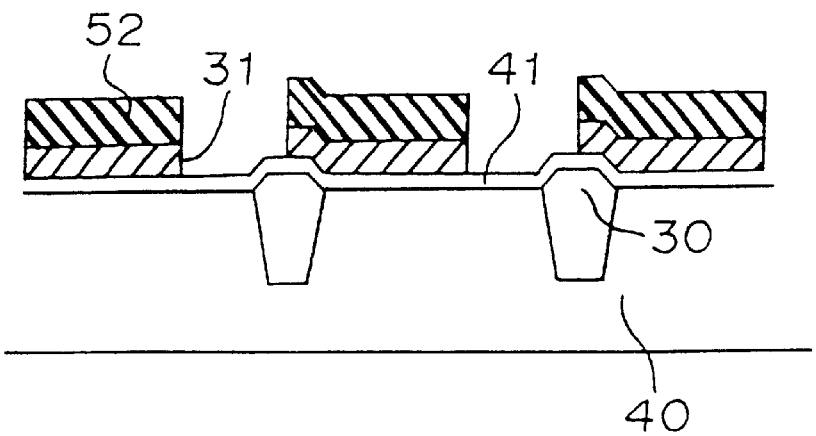
Figure 20:
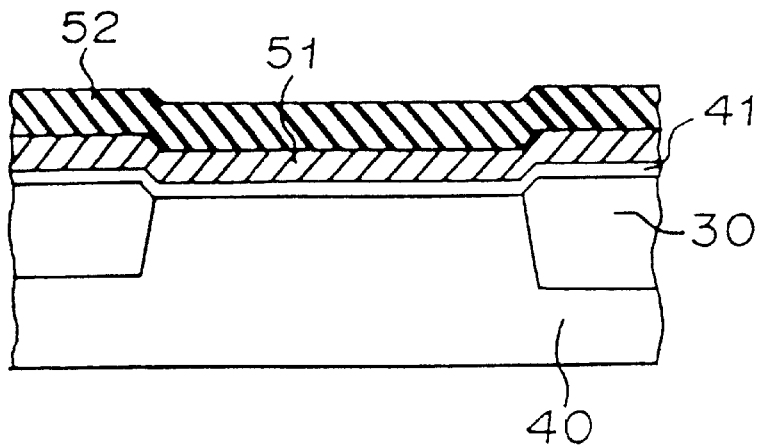
Figure 21:
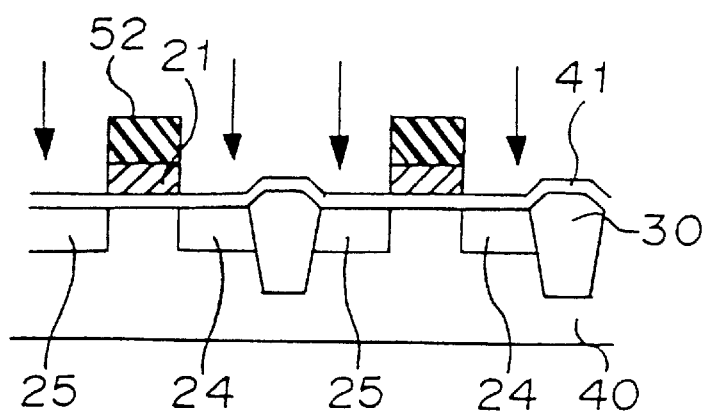
FIG. 21a is a cross sectional view for showing a part of the region of memory cell array of the conventional semiconductor device after a fourth step.
FIG. 21b is a cross sectional view for showing a part of the connecting region of the conventional semiconductor device after the fourth step.
FIG. 21c is a cross sectional view for showing a part of the region of peripheral circuit of the conventional semiconductor device after the fourth step.
Figure 21:
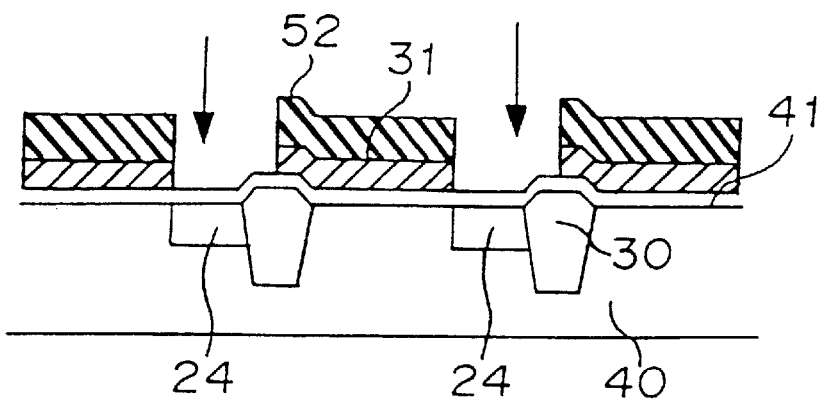
Figure 21:
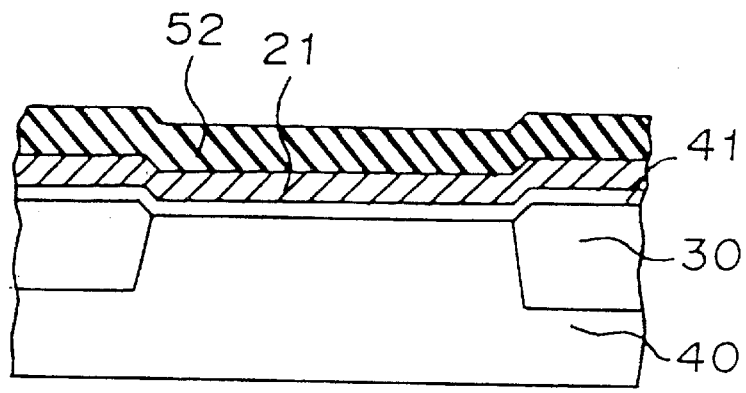
Figure 22A:
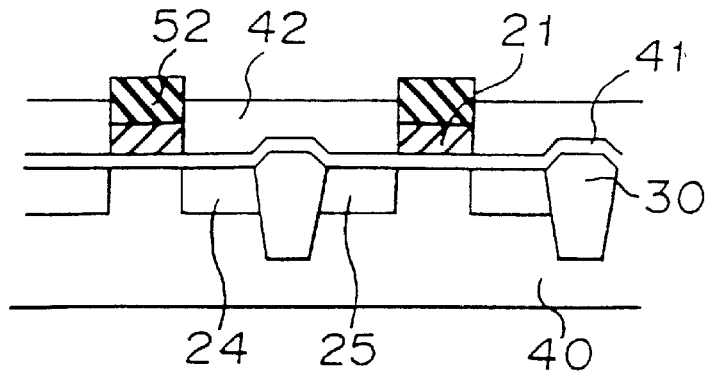
FIG. 22a is a cross sectional view for showing a part of the region of memory cell array of the conventional semiconductor device after a fifth step.
Figure 22B:
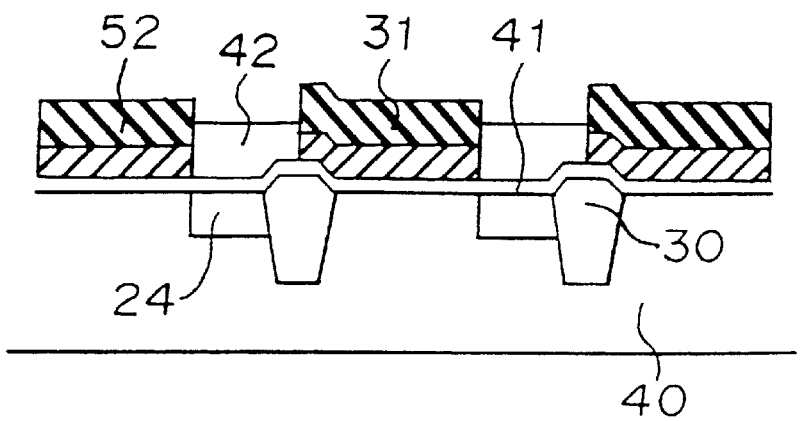
FIG. 22b is a cross sectional view for showing a part of the connecting region of the conventional semiconductor device after the fifth step.
Figure 22C:
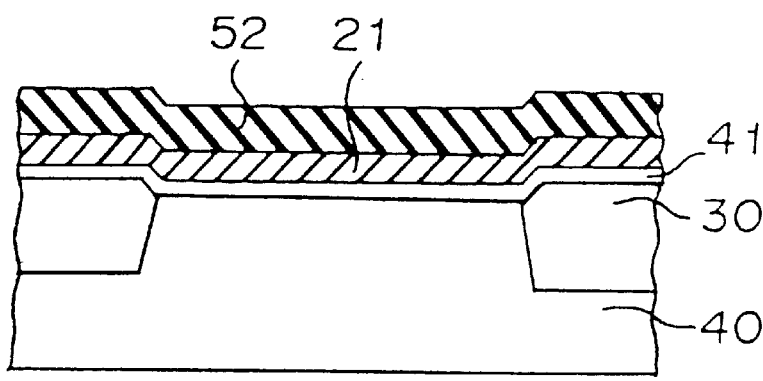
FIG. 22c is a cross sectional view for showing a part of the region of peripheral circuit of the conventional semiconductor device after the fifth step.
Figure 23A:
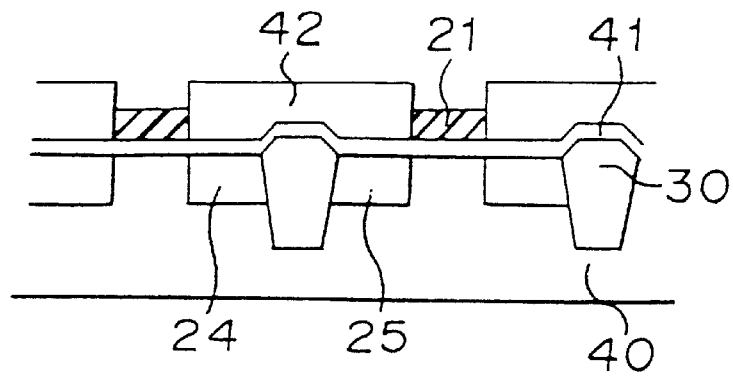
FIG. 23a is a cross sectional view for showing a part of the region of memory cell array of the conventional semiconductor device after a sixth step.
Figure 23B:
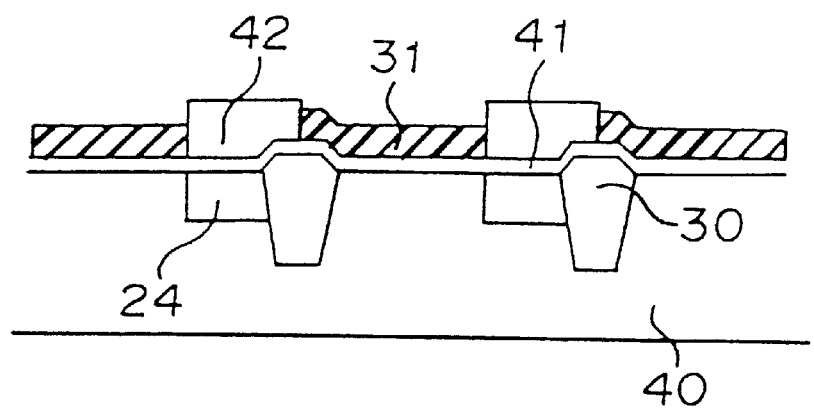
FIG. 23b is a cross sectional view for showing a part of the connecting region of the conventional semiconductor device after the sixth step.
Figure 23C:
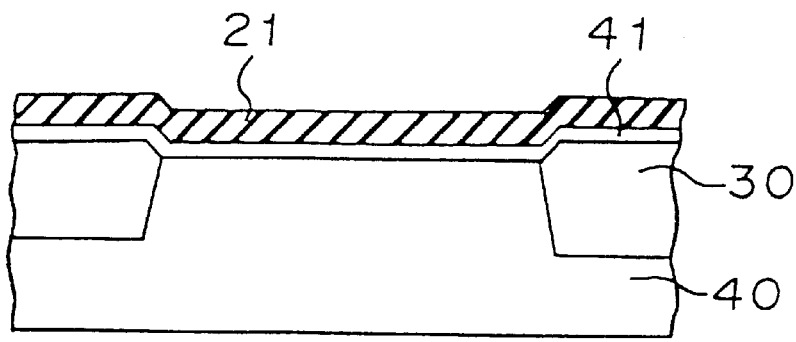
FIG. 23c is a cross sectional view for showing a part of the region of peripheral circuit of the conventional semiconductor device after the sixth step.
Figure 24:
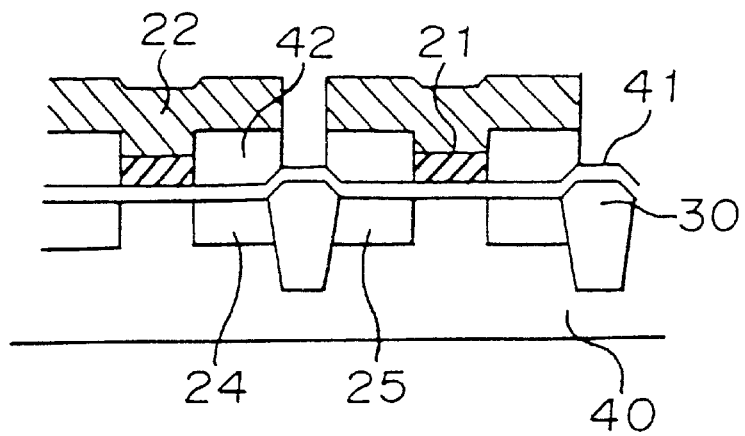
FIG. 24a is a cross sectional view for showing a part of the region of memory cell array of the conventional semiconductor device after a seventh step.
FIG. 24b is a cross sectional view for showing a part of the connecting region of the conventional semiconductor device after the seventh step.
FIG. 24c is a cross sectional view for showing a part of the region of peripheral circuit of the conventional semiconductor device after the seventh step.
Figure 24:
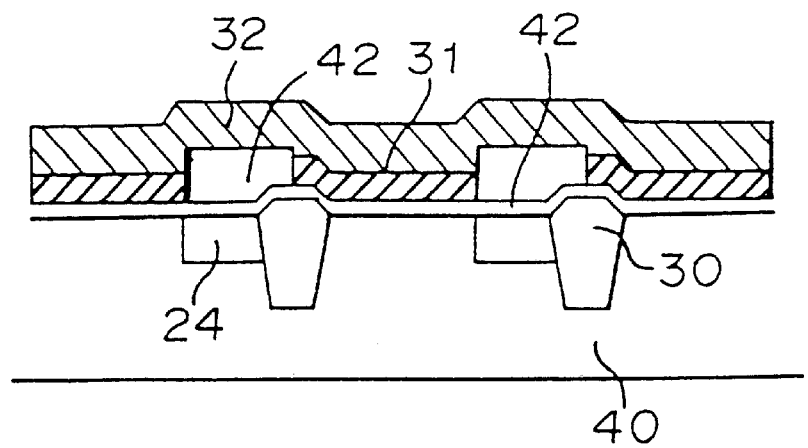
Figure 24:
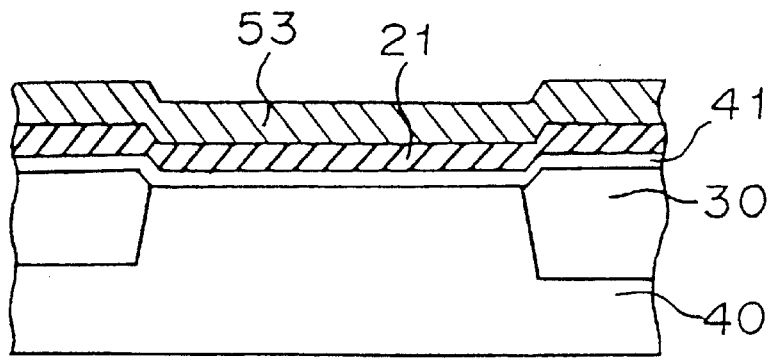
Figure 25:
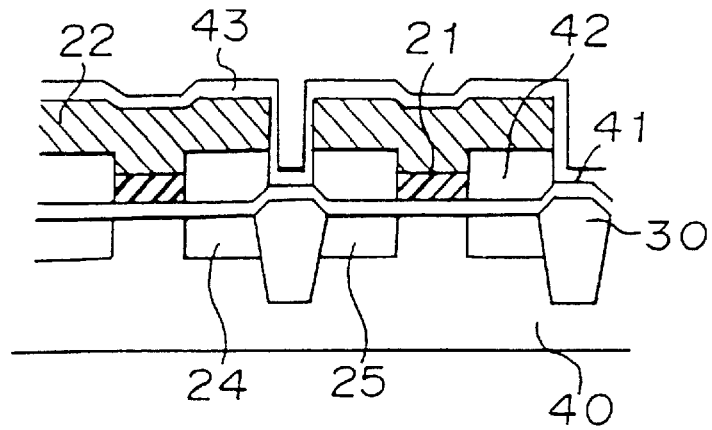
FIG. 25a is a cross sectional view for showing a part of the region of memory cell array of the conventional semiconductor device after an eighth step.
FIG. 25b is a cross sectional view for showing a part of the connecting region of the conventional semiconductor device after the eighth step.
FIG. 25c is a cross sectional view for showing a part of the region of peripheral circuit of the conventional semiconductor device after the eighth step.
Figure 25:
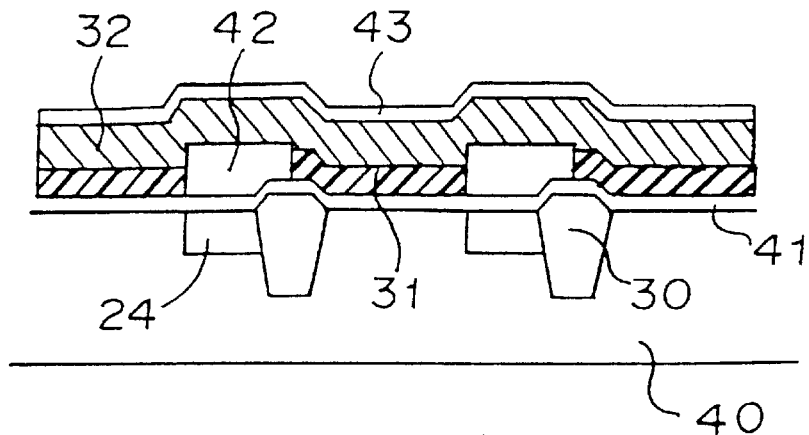
Figure 25:
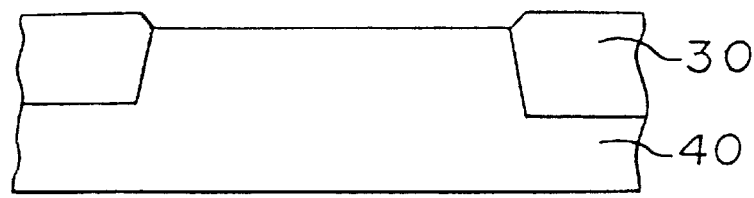
Figure 26:
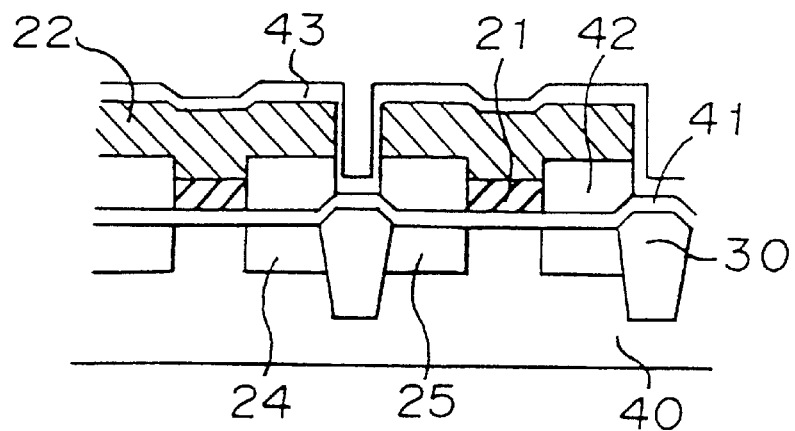
FIG. 26a is a cross sectional view for showing a part of the region of memory cell array of the conventional semiconductor device after a ninth step.
FIG. 26b is a cross sectional view for showing a part of the connecting region of the conventional semiconductor device after the ninth step.
FIG. 26c is a cross sectional view for showing a part of the region of peripheral circuit of the conventional semiconductor device after the ninth step.
Figure 26:
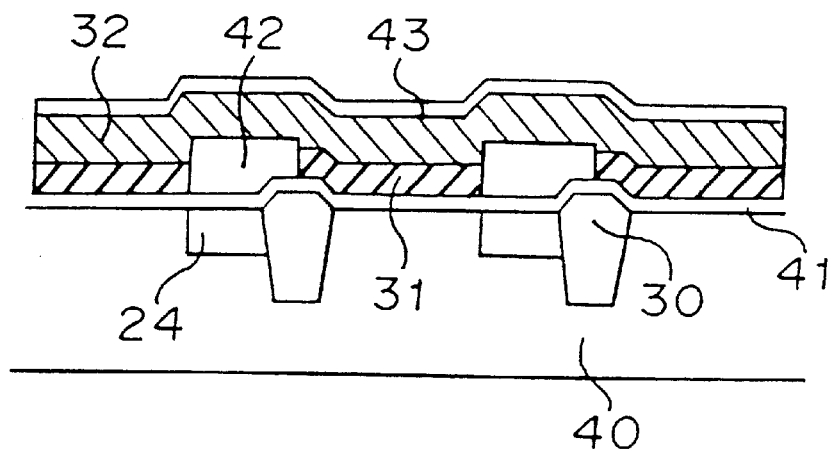
Figure 26:
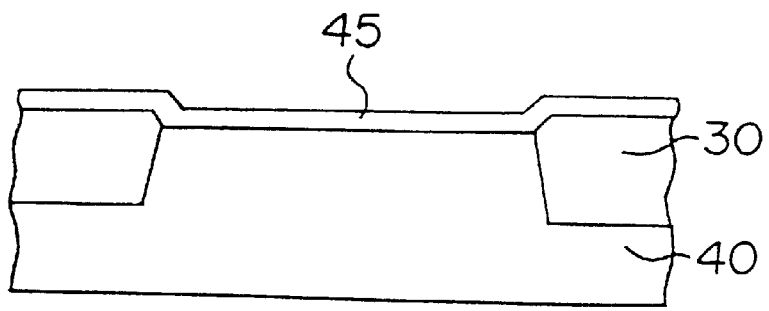
Figure 27A:
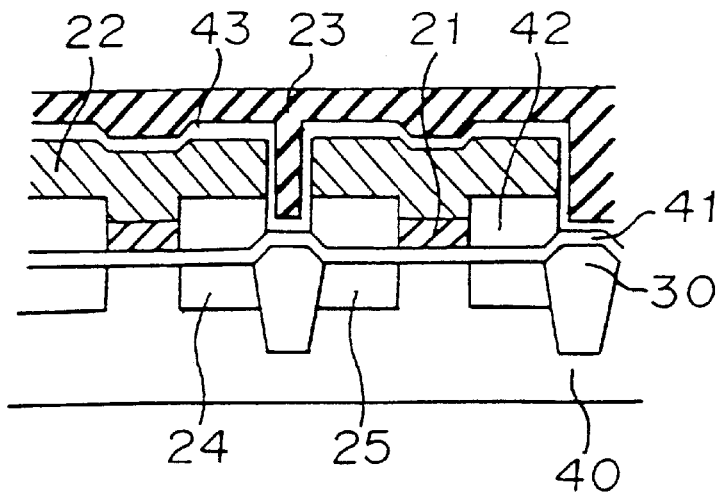
FIG. 27a is a cross sectional view for showing a part of the region of memory cell array of the conventional semiconductor device after a tenth step.
Figure 27B:
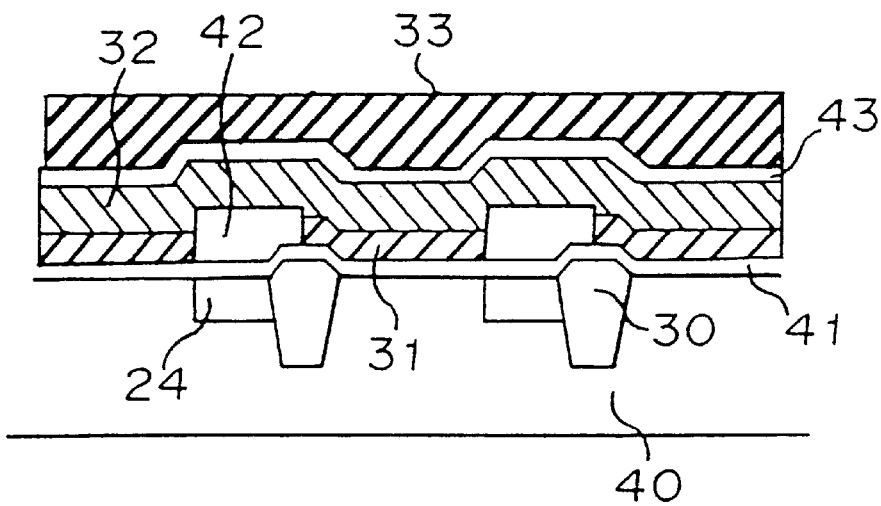
FIG. 27b is a cross sectional view for showing a part of the connecting region of the conventional semiconductor device after the tenth step.
Figure 27C:
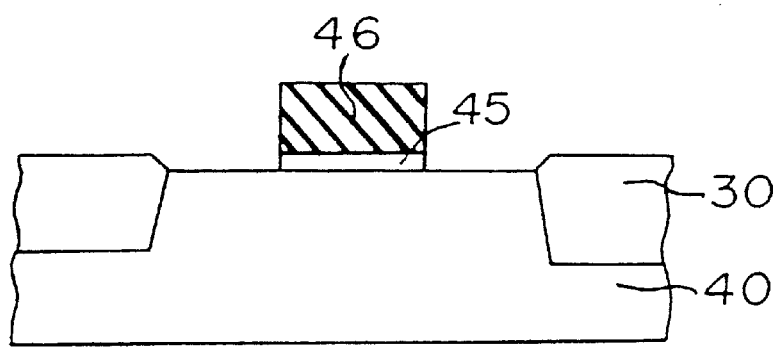
FIG. 27c is a cross sectional view for showing a part of the region of peripheral circuit of the conventional semiconductor device after the tenth step.
Figure 28:
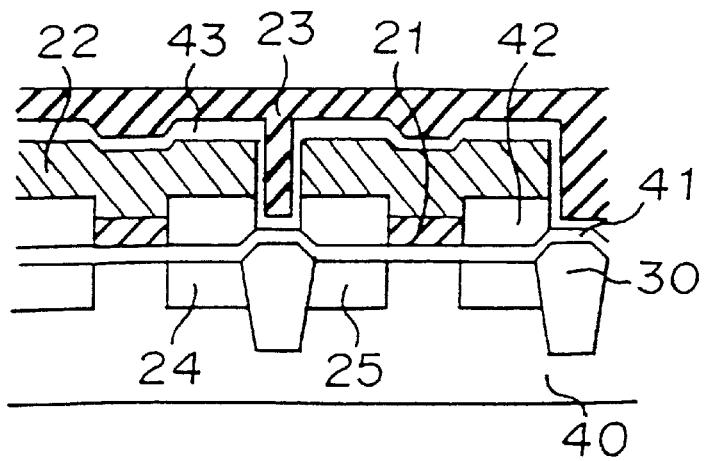
FIG. 28a is a cross sectional view for showing a part of the region of memory cell array of the conventional semiconductor device after an eleventh step.
FIG. 28b is a cross sectional view for showing a part of the connecting region of the conventional semiconductor device after the eleventh step.
FIG. 28c is a cross sectional view for showing a part of the region of peripheral circuit of the conventional semiconductor device after the eleventh step.
Figure 28:
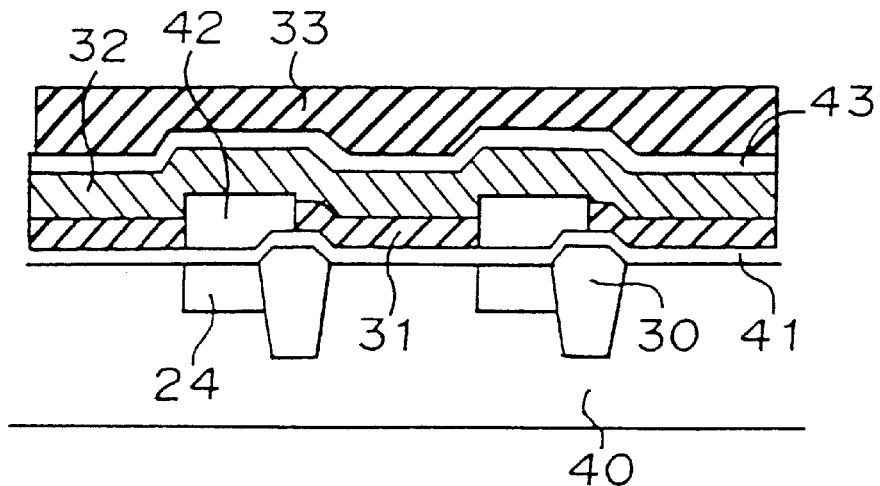
Figure 28:
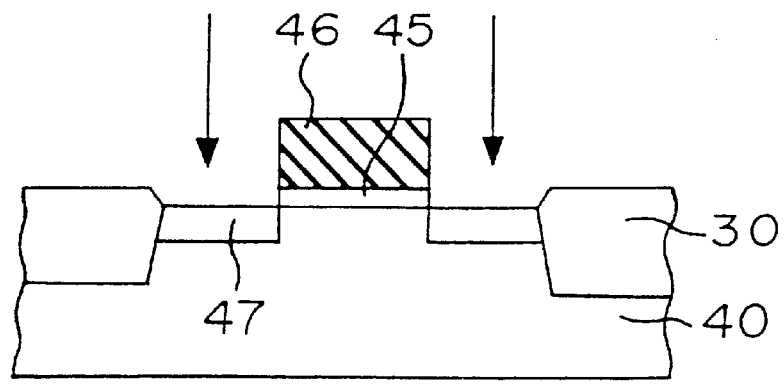
Figure 29A:
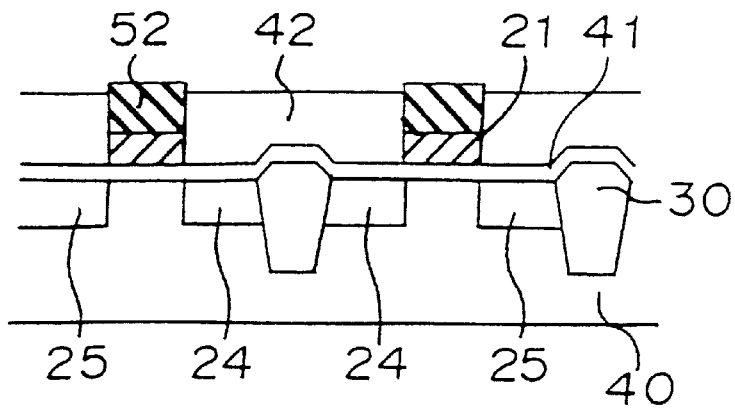
FIG. 29a is a cross sectional view for showing a part of the region of memory cell array of the conventional semiconductor device after a twelfth step.
Figure 29B:
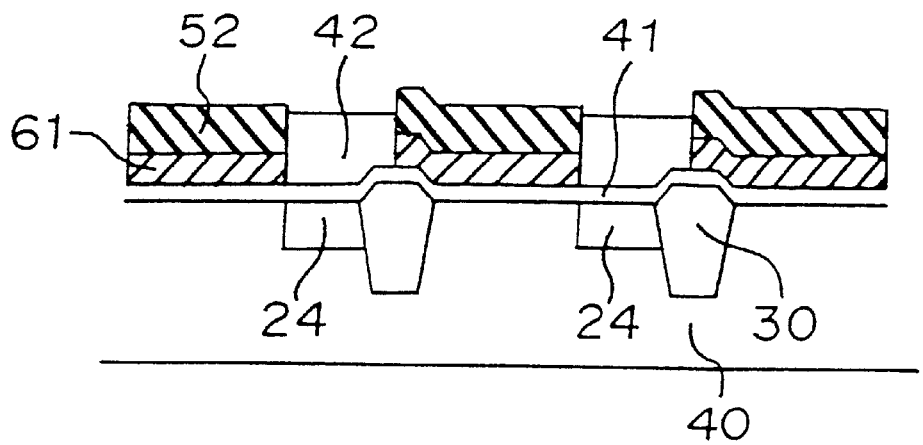
FIG. 29b is a cross sectional view for showing a part of the connecting region of the conventional semiconductor device after the twelfth step.
Figure 29C:
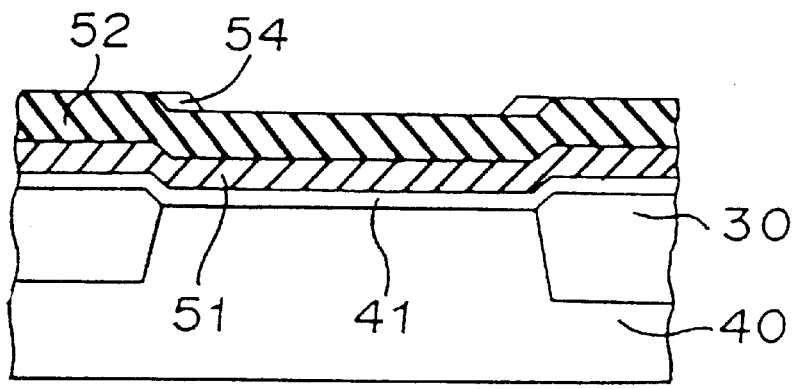
FIG. 29c is a cross sectional view for showing a part of the region of peripheral circuit of the conventional semiconductor device after the twelfth step.
Figure 30:
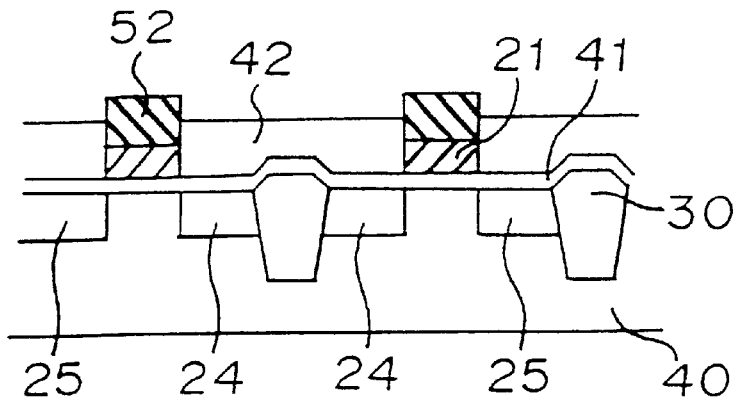
FIG. 30a is a cross sectional view for showing a part of the region of memory cell array of the conventional semiconductor device at a time of wet etching.
FIG. 30b is a cross sectional view for showing a part of the connecting region of the conventional semiconductor device at a time of wet etching.
FIG. 30c is a cross sectional view for showing a part of the region of peripheral circuit of the conventional semiconductor device at a time of wet etching.
Figure 30:
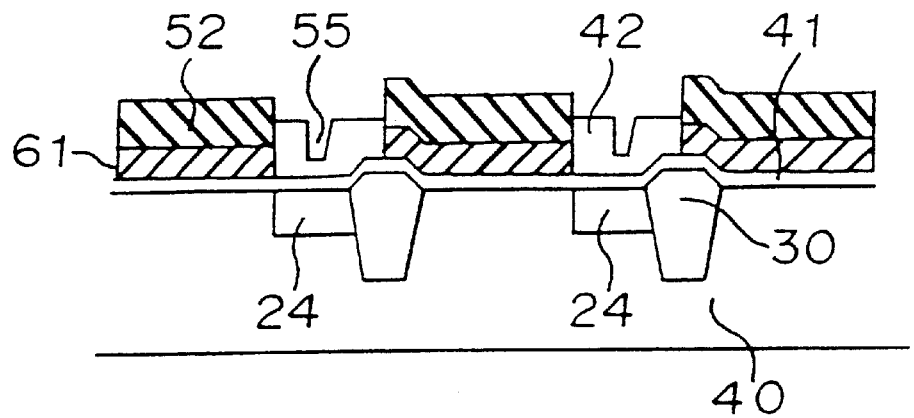
Figure 30:
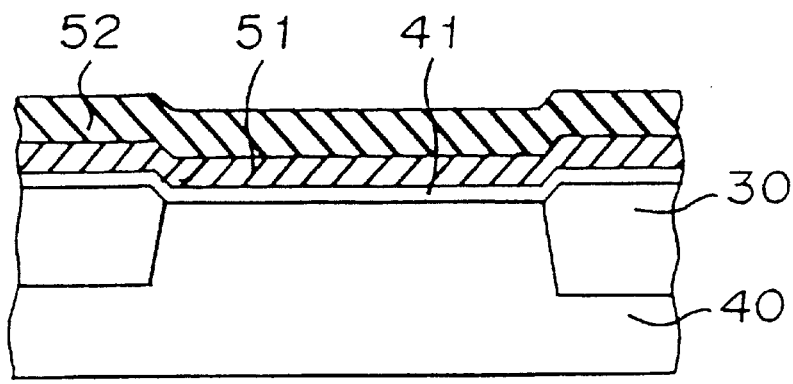

Solution of the problem of shadowing, which is the second problem in the conventional technique, will be described. As shown in FIG. 17, the first drain source is formed after forming the first polysilicon and the silicon nitride film. Accordingly, in a case that a drain source is obliquely implanted, ions can be normally implanted without interference of a remaining gate 61 of the first polysilicon and the silicon nitride film 32 because a space between the remaining gates 61 of the first polysilicon is wider than that of the conventional technique as shown in FIG. 8, whereby the drain area 24 of transistors in the memory cell can be normally formed.

Heretofore, the region of memory cell array 11 and the region of first selection gate 12 are exemplified. Further, the above-mentioned problems can be solved in the region of second selection gate 13 which is a similar connecting region to the region of first selection gate 12.

Figure 9:
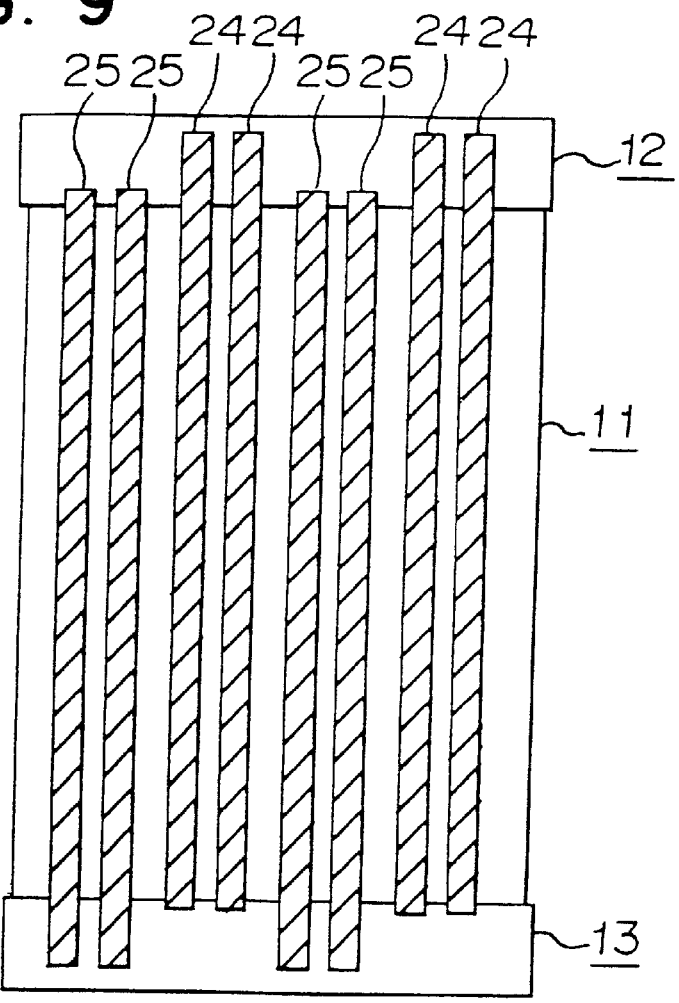
FIG. 9 schematically shows a drain area and a source area of transistors of memory cell of the semiconductor device according to Embodiment 1 of the present invention.

FIG. 9 shows a relationship of arrangement of the drain area 24 and the source area 25 of the memory cell transistors within the region of memory cell array 11, the region of first selection gate 12, and the region of second selection gate 13. The drain area 24 of the memory cell transistors extends from the region of memory cell array 11 to the region of first selection gate 12. The source area 25 of memory cell transistors extends from the region of memory cell array 11 to the region of second selection gate 13. However, not like the conventional technique shown in FIG. 34, two pairs of the drain areas 24 of memory cell transistors and the two pairs of source areas 25 of memory cell transistors are arranged in this Embodiment. Similar effect to that in the region of first selection gate 12 is obtainable in the region of second selection gate 13 by such a structure of providing the two pairs of drain areas 24 and the two pairs of source areas 25.

Figure 13:
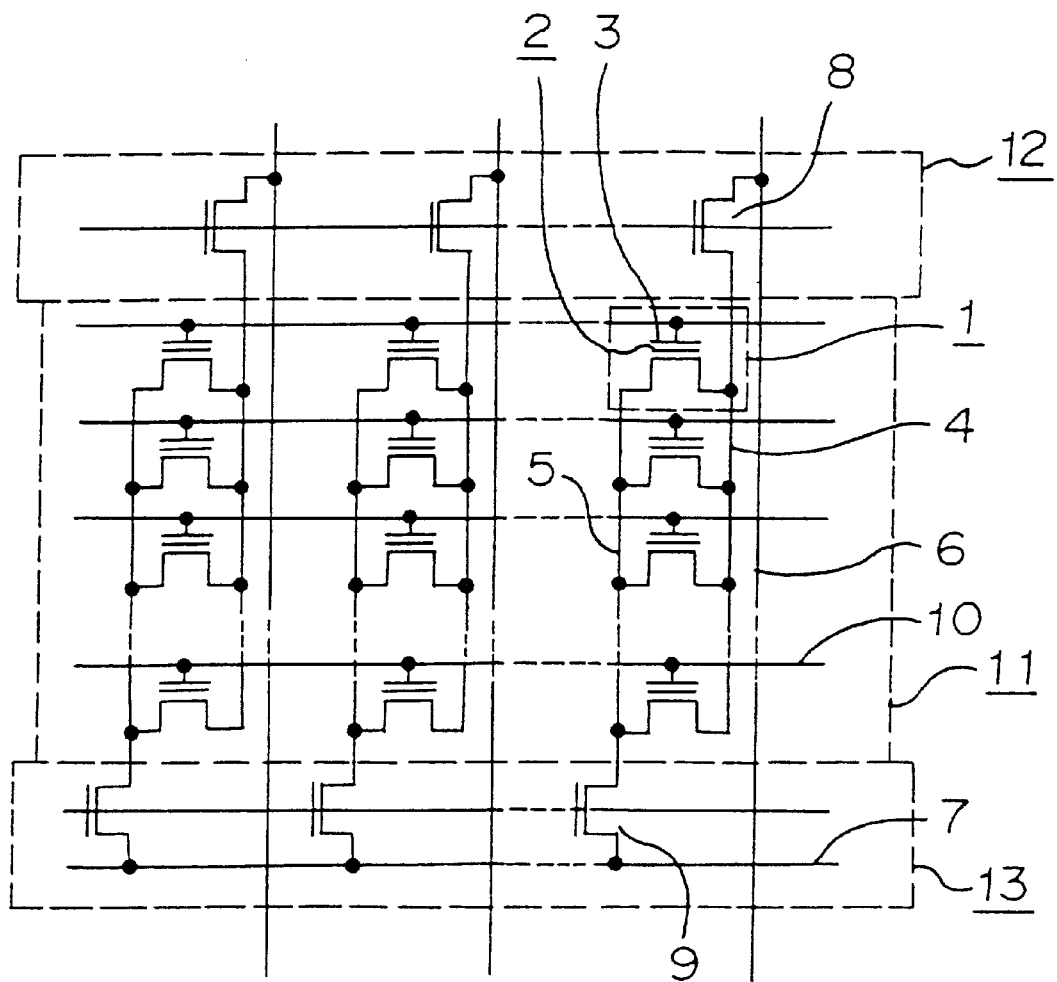
FIG. 13 is an equivalent circuit diagram of a region of memory cell array and a connecting region in accordance with the conventional semiconductor device.
Figure 14:
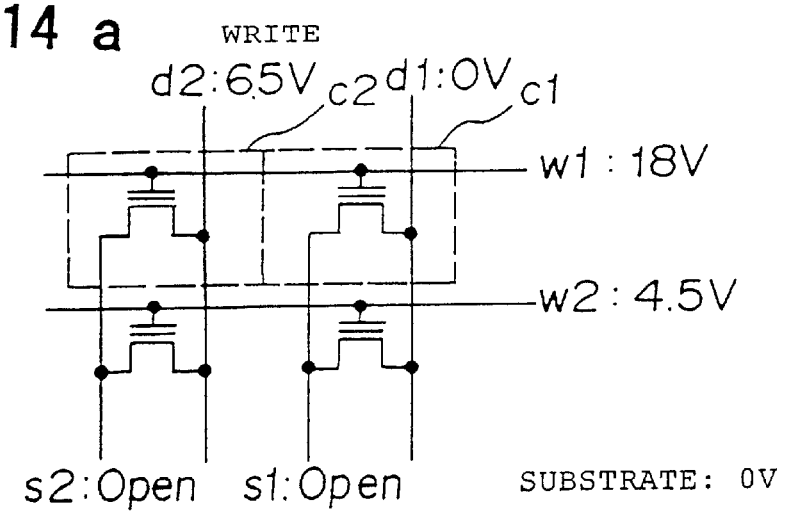
FIG. 14a schematically shows a part of the conventional semiconductor device under write operation.
FIG. 14b schematically shows a part of the conventional semiconductor device under read operation.
FIG. 14c schematically shows a part of the conventional semiconductor device under erase operation.
Figure 14:
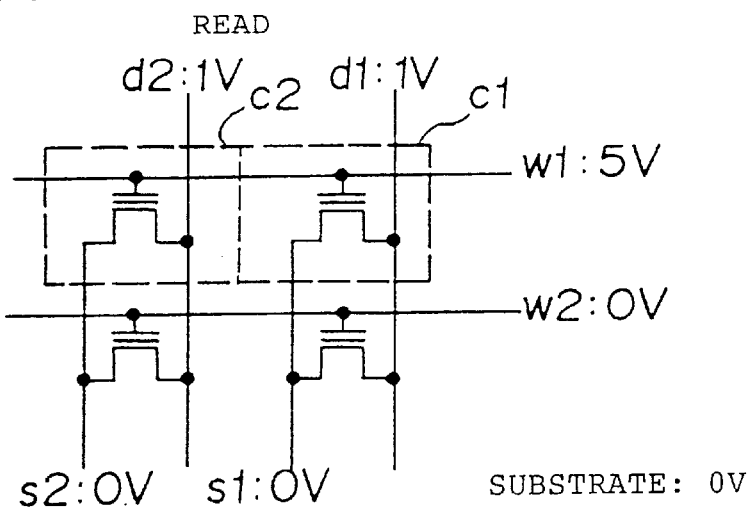
Figure 14:
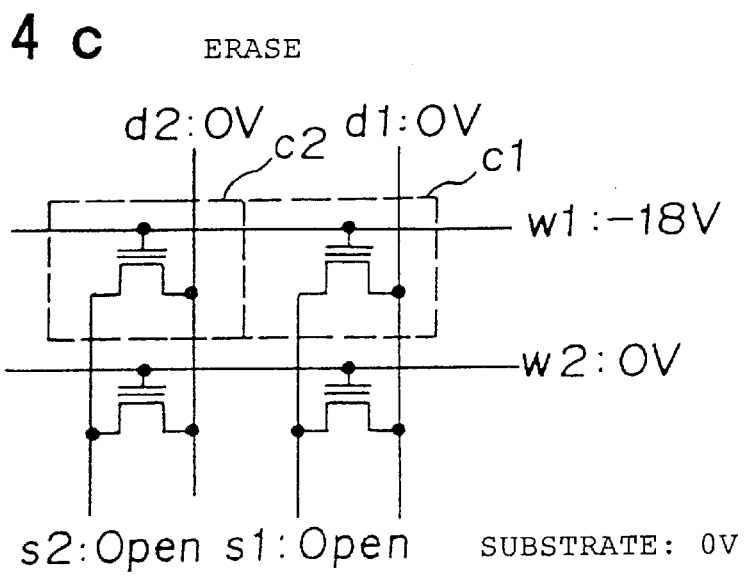

In the next, improvement of an yield of device caused from the region of memory cell array, which is the third problem, will be described. As shown in FIG. 1, a pair of drain areas 24 and/or a pair or source areas 25 of memory cell transistors are adjacent to each other interposing the trench isolation 30. If pattern defects such as foreign matters are generated in the trench isolation 30, these drain areas 24 or these source areas 25 of memory cell transistors are shorted. Because an AND-type flash memory of the present invention is operated as shown in FIG. 14, a problem in operation occurs when a drain area 24 of transistors in the memory cell is shorted, namely a local data line 4 shown in FIG. 13 is shorted similarly to the conventional technique, whereby the memory cells connected to such a local data lines can not be used. However, when a short occurs between a pair of source areas 25 of memory cell transistors, namely between a pair of local source lines 5 shown in FIG. 13, a problem in operation is not caused even though the short occurs because electric potential of the local source lines 5 remains the same with respect to types of operation, not like in the conventional technique. Therefore, it is possible to substantially halve the problem of short than that in the conventional technique, whereby an yield can be enhanced.

Embodiment 2

In course of tests in contriving the present invention, a relationship between generation of seams and a space between pieces of first polysilicon is known.

TABLE 1

| Space between pieces of first polysilicon | 0.4 μm | 0.45 μm | 0.5 μm |
|---|---|---|---|
| Generation of seams (evaluation on wafer surface) | Exist on the whole surface of wafer | Exist on a part of wafer | Not exist |

In Table 1, evaluation of the production of seams on the silicon wafer surface is shown under conditions that the space of first polysilicon is respectively 0.4 μm, 0.45 μm, and 0.5 μm. It is known from this Table that seams are not produced if the space of first polysilicon is 0.5 μm or more.

Embodiemtn 3

Figure 10:
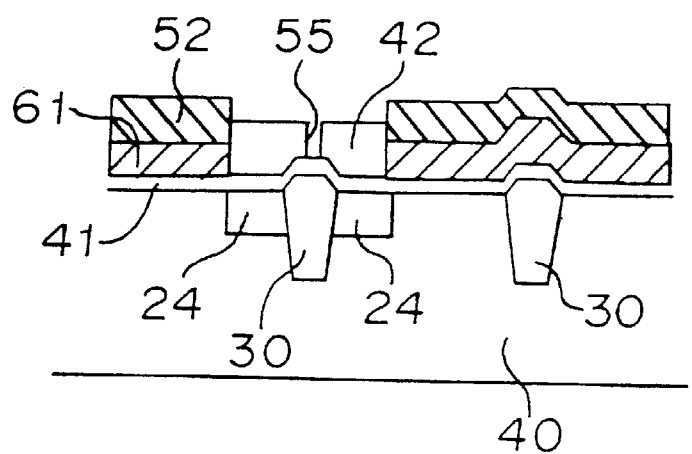
FIG. 10 is a cross sectional view for showing a part of a connecting region of a semiconductor device according to Embodiment 3 of the present invention.

Further, a case that the space of first polysilicon would be less than 0.5 μm by future-micromiaturization will be described. FIG. 10 shows the case that space of first polysilicon is less than 0.5 μm in section taken along the line II—II of the region of first selection gate 12 in FIG. 1. In FIG. 10, numerical reference 55 designates a seam. Such a seam is generally apt to be produced in a center portion of inter-layer insulating film in which it is buried. However, in Embodiment 3 of the present invention, trench isolation is positioned below the seam 55. Therefore, even though second polysilicon is formed thereafter, a short between a drain area 24 and a source area 25 of transistors in a memory cell does not occur.

Thus it is possible to realize a non-volatile semiconductor memory device which does not cause operational problems even in a case that a space of first polysilicon is less than 0.5 μm because the trench isolation 30 as an isolating area exists between drain areas 24 of memory cell transistors.

Embodiment 4

Figure 11:
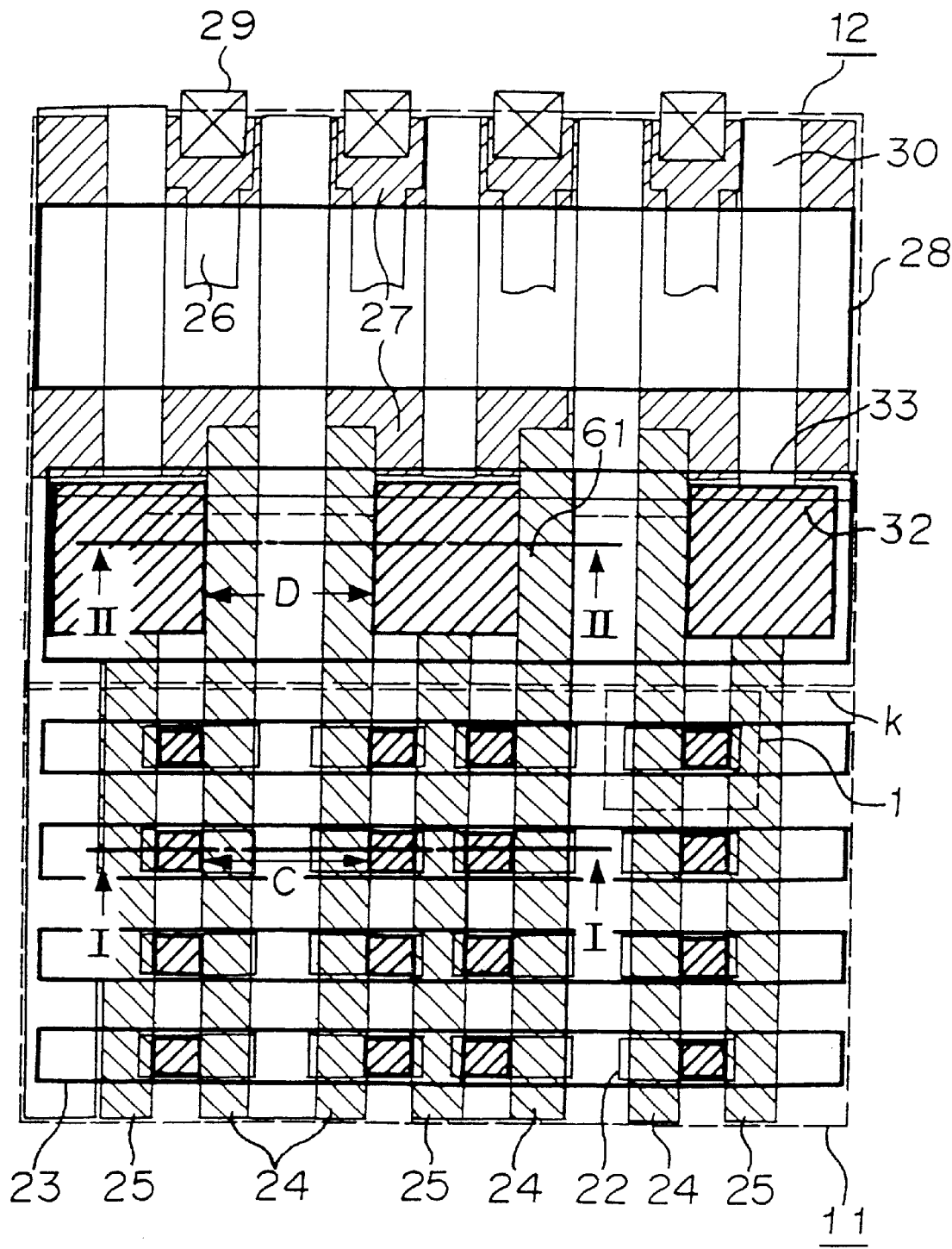
FIG. 11 schematically shows a layout pattern of a region of memory cell array and a connecting region of a semiconductor device after forming a first metal according to Embodiment 4 of the present invention.

FIG. 11 shows a semiconductor device according to Embodiment 4 of the present invention, wherein a layout pattern of a region of memory cell array and a region of first selection gate after forming a first metal is shown. In FIG. 11, the same references as those shown in FIG. 1 designate the same portions to those shown in FIG. 1.

Hereinbelow, differences between layout patterns of Embodiment 1 and of Embodiment 4 will be described in comparison with FIG. 1 and FIG. 11.

In Embodiment 1, the drain areas 24 and the source areas 25 of transistors in the memory cell are respectively arranged interposing the trench isolation 30. However, in Embodiment 4, although drain areas 24 of transistors in a memory cell are arranged interposing trench isolation 30, source areas 25 of transistor in the memory cells are arranged without interposing trench isolation 30. Accordingly, source areas of transistor in adjacent memory cells are commonly used by these memory cells.

Further, the width of the source area of memory cell transistor is equal to the width of one of the drain area 24 of memory cell transistor.

In other words, in Embodiment 4, a half of the width of isolating areas and a half of the width of the source areas are respectively reduced in each memory cell. This is, as known from the description of operation about FIG. 14, because source areas 25 of memory cell transistors, namely local source lines, have identical potential among the memory cells in various types of operation of AND-type flash memory, whereby a similar effect to that in Embodiment 1 can be obtained even though trench isolation 30 is not provided between source areas of memory cell transistors.

Figure 12A:
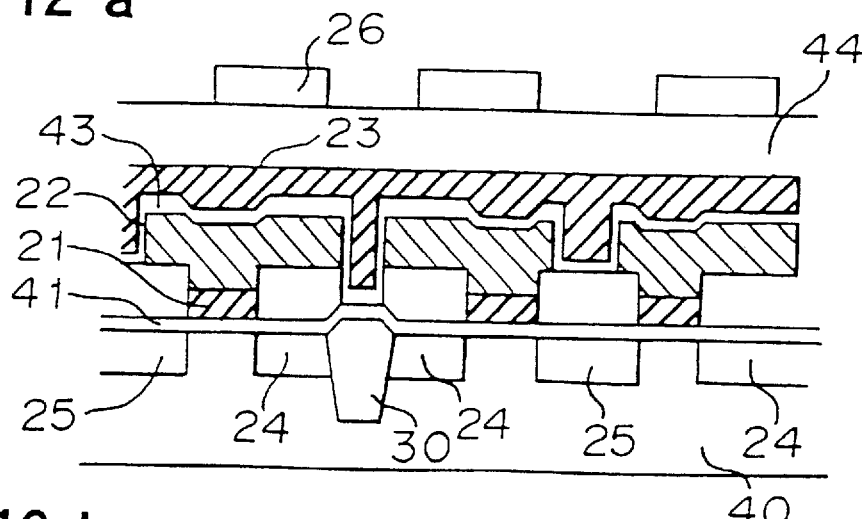
FIG. 12a is a cross sectional view for showing a part of the region of memory cell array of the semiconductor device after forming the first metal according to Embodiment 4 of the present invention.
Figure 12B:
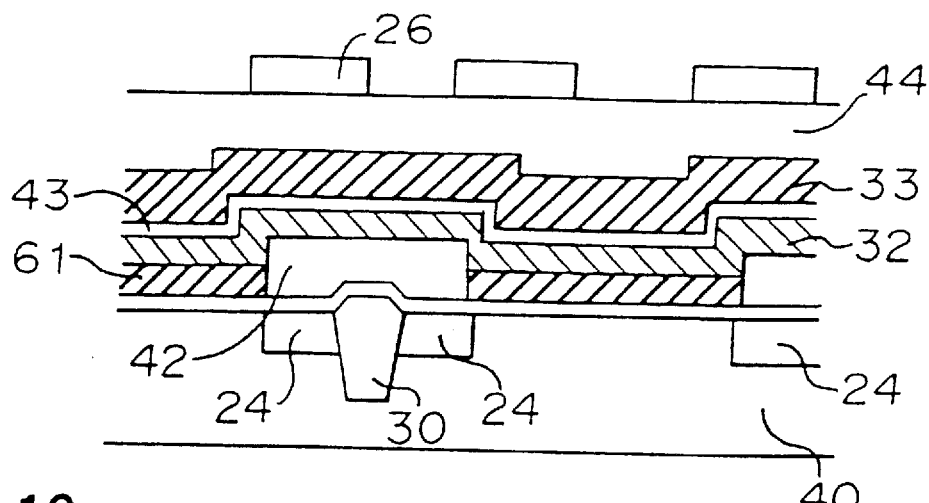
FIG. 12b is a cross sectional view for showing a part of a connecting region of the semiconductor device after forming the first metal according to Embodiment 4 of the present invention.
Figure 12C:
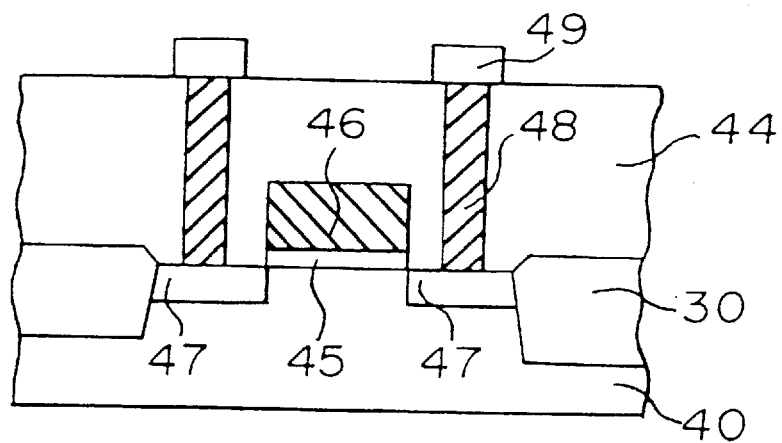
FIG. 12c is a cross sectional view for showing a part of a region of peripheral circuit of the semiconductor device after forming the first metal according to Embodiment 4 of the present invention.

In the next, FIGS. 12a through 12c show cross sectional views of the region of memory cell array, the connecting region, and the region of peripheral circuit. FIG. 12a is a cross sectional view of the region of memory cell array taken along a line I—I in FIG. 11; FIG. 12b is a cross sectional view of the region of first selection gate 12 taken along a line II—II in FIG. 11; and FIG. 12c is a cross sectional view of a region of generally used region of peripheral circuit of AND-type flash memory (not shown).

Although, in Embodiment 1, there are two pieces of trench isolation 30 in each cross sectional view, there are only one piece of trench isolation 30 in Embodiment 4 as shown in FIG. 12a and 12b. Incidentally, the region of peripheral circuit is the same as that in Embodiment 1.

As described, because a similar characteristic to that in Embodiment 1 is provided in Embodiment 4, a similar effect to that of Embodiment 1 is obtainable. Further, the following effects are obtainable in Embodiment 4:

At first, it is possible to realize a small memory cell by reducing a half of the width of isolating areas and a half of the width of source areas in each memory cell 1.

Specifically, provided that the width of isolation, the width of drain, the width of source, and the gate length of lower floating gate are W, the width of memory cell in Embodiment 1 becomes 4 W, obtained by W (isolation)+W (lower floating gate)+2W (drain area and source area) and that in Embodiment 4 becomes 3W, obtained by 0.5W (isolation)+W (lower floating gate)+1.5W (drain area and source area), wherein the width of memory cell is narrower by as much as W in Embodiment 4.

Secondarily, it is possible to restrict generation of a lattice defect caused by a stress generated by formation of trench isolation 30 and thereby a junction leak can be suppressed because the density of trench isolation 30 in the region of memory cell array 11 is small. Specifically, provided that the widths of memory cells are respectively 4W and 3W respectively in accordance with Embodiment 1 and Embodiment 4, a ratio between the width of isolation and the width of memory cell is 25% in Embodiment 1, and 17% in Embodiment 4. Thus the density of trench isolation 30 is decreased.

Although, in Embodiment 4, the width of source area 1W of memory cell transistor is commonly used by two memory cells, it is possible to decrease the width of memory cell by as much as a width of isolation of 0.5W by removing trench isolation between the source areas of all memory cell transistors even though a width of 1W is respectively provided for all memory cells.

Heretofore, an AND-type flash memory is exemplified. However, the present invention is similarly applicable to a non-volatile semiconductor device provided with drain areas of memory cell transistors, source areas thereof, and a portion for connecting these areas to drain source areas of transistors in a connecting region.

First advantage of the present invention is that production of seams can be restricted and an influence of shadowing can be suppressed because a method of producing a semiconductor is to pattern so that a space of the lowest conductive layer in a region of memory cell array is equal to that in the connecting region.

Second advantage of the present invention is that production of seams can be restricted by rendering a space of the lowest conductive layer 0.5 μm or more.

The third advantage of the present invention is that a drop of yield caused by a short between drain areas and source areas of a memory cell transistor can be restricted because drain areas of the memory cell transistors are oppositely arranged to each other interposing isolating areas and source areas of memory cell transistors are oppositely arranged to each other interposing isolating areas.

The fourth advantage of the present invention is that a short between second polysilicon and a drain area of a memory cell transistor or a short between second polysilicon and a source area of the memory cell transistor can be avoided because even though a seam is produced, a center portion between lowest conductive layers is an isolating area.

The eighth advantage of the present invention is that a junction leak can be suppressed because a memory cell can be small and the density of trench isolation can be decreased by interposing an isolating area between drain areas of a memory cell transistor such that the drain areas are oppositely arranged to each other.

The ninth advantage of the present invention is that a junction leak can be suppressed because a memory cell can be further small and the density of trench isolation is decreased by providing a source area of a memory cell transistor so as to be commonly used by an memory cell and by substantially equalizing the width of drain area and the width of source area of the memory cell transistors.

What is claimed is:

1. A non-volatile semiconductor memory device, comprising:

a semiconductor substrate;

memory cells;

a region of memory cell array in which said memory cells are arranged in a matrix-like form;

a region of peripheral circuit;

a connecting region connecting said region of memory cell array to said region of peripheral circuit; and lowest conductive layers provided over said substrate with intervals between each other, wherein said interval of said lowest conductive layers in said region of memory cell array is substantially equal to said interval of said lowest conductive layers in said connecting region, and two diffusion regions are continuously formed between said lowest conductive layers in said region of memory cell array and said connecting region while interposing an isolation region between said two diffusion regions.

2. A non-volatile semiconductor memory device according to claim 1, wherein said intervals are 0.5 μm or more.

3. The non-volatile semiconductor memory device according to claim 1, further comprising:

an insulating film on said diffusion regions and said isolation regions and between said lowest conductive layers; and second conductive layers in contact with upper sides of said insulating film and respectively on the lowest conductive layers.

* * * * *